(12) United States Patent
Ballantine et al.

(10) Patent No.: US 11,169,217 B2
(45) Date of Patent: Nov. 9, 2021

(54) ELECTROCHEMICAL IMPEDANCE SPECTROSCOPY ANALYZER ("EISA") BATTERY PERFORMANCE DATABASE

(71) Applicant: BLOOM ENERGY CORPORATION, San Jose, CA (US)

(72) Inventors: Arne Ballantine, Palo Alto, CA (US); John Cronin, Jericho, VT (US); Joseph Bodkin, Williston, VT (US)

(73) Assignee: BLOOM ENERGY CORPORATION, San Jose, CA (US)

( * ) Notice: Subject to any disclaimer, the term of this patent is extended or adjusted under 35 U.S.C. 154(b) by 297 days.

(21) Appl. No.: 16/363,160

(22) Filed: Mar. 25, 2019

(65) Prior Publication Data

US 2019/0317151 A1 Oct. 17, 2019

Related U.S. Application Data

(60) Provisional application No. 62/647,236, filed on Mar. 23, 2018.

(51) Int. Cl.
| | | |
|---|---|---|
| *G01R 31/389* | (2019.01) | |
| *G01R 31/367* | (2019.01) | |
| *H02J 7/00* | (2006.01) | |

(52) U.S. Cl.
CPC ......... *G01R 31/389* (2019.01); *G01R 31/367* (2019.01); *H02J 7/007* (2013.01)

(58) Field of Classification Search
CPC .................................................... G01R 31/389
USPC ......................................................... 702/63
See application file for complete search history.

(56) References Cited

U.S. PATENT DOCUMENTS

| | | | | |
|---|---|---|---|---|
| 6,526,361 | B1 * | 2/2003 | Jones | G01R 31/36 |
| | | | | 702/63 |
| 8,958,998 | B2 * | 2/2015 | Bertness | G01R 31/385 |
| | | | | 702/63 |
| 9,461,319 | B2 | 10/2016 | Sudhan et al. | |
| 9,461,320 | B2 | 10/2016 | Ballantine et al. | |
| 2003/0204328 | A1 * | 10/2003 | Tinnemeyer | G01R 31/382 |
| | | | | 702/30 |
| 2014/0114592 | A1 * | 4/2014 | Eilertsen | G01R 31/64 |
| | | | | 702/58 |
| 2015/0228990 | A1 * | 8/2015 | Ballantine | H01M 8/249 |
| | | | | 429/430 |
| 2015/0244011 | A1 * | 8/2015 | Sudhan | H01M 8/04649 |
| | | | | 429/430 |
| 2017/0077535 | A1 | 3/2017 | Sudhan et al. | |
| 2017/0219660 | A1 * | 8/2017 | Christensen | B60L 58/16 |

(Continued)

OTHER PUBLICATIONS

U.S. Appl. No. 16/363,214, filed Mar. 25, 2019, Bloom Energy Corporation.

(Continued)

*Primary Examiner* — Ricky Go
(74) *Attorney, Agent, or Firm* — The Marbury Law Group PLLC

(57) ABSTRACT

Electrochemical impedance spectroscopy (EIS) data collected over a period of time for a large number of batteries and different types of batteries, may be collected and analyzed to generate or refine a learned database of EIS waveforms and induction responses to perform in-situ analysis of the battery and suggest optimal time for charging the battery.

18 Claims, 17 Drawing Sheets

(56) References Cited

U.S. PATENT DOCUMENTS

2017/0302088 A1* 10/2017 Tkachenko .......... H02J 7/0045

OTHER PUBLICATIONS

U.S. Appl. No. 16/363,262, filed Mar. 25, 2019, Bloom Energy Corporation.
U.S. Appl. No. 16/363,361, filed Mar. 25, 2019, Bloom Energy Corporation.
U.S. Appl. No. 16/363,435, filed Mar. 25, 2019, Bloom Energy Corporation.

* cited by examiner

Charging Algorithm – Decision Matrix

| Test ID | Waveform | Response Waveform | Difference Amplitude as Percentage change | Difference Frequency as Percentage change | Recommendation |
|---|---|---|---|---|---|
| 1 | Sinusoid wave, 100 Hz | Response file 1.dat | 5-10 % | 2-5 % | No need for charging |
| 2 | Sinusoid wave, 100 Hz | Response file 2.dat | >10 % and <20% | 2-5 % | Charging required |
| 3 | Sinusoid Wave, 200 Hz | Response file 3.dat | 0-2 % | 0-2 % | No need for Charging |
| 4 | Sinusoid Wave, 200 Hz | Response file 4.dat | 2-5 % | 2-5 % | Charging required, slow trickle charging |
| 5 | Sinusoid Wave, 200 Hz | Response file 5.dat | 5-10 % | 5-10 % | Fast Charging till 40 % SoC followed by Normal Charging |

FIG. 12

| Battery Type | Battery ID | Waveform | Commands | Response Waveform Range | Charger Type | Charging Current | Charging Voltage |
|---|---|---|---|---|---|---|---|
| Li-ion, MNC | LiXXXX | Sinusoid, 100 Hz, 2mA | Apply input for 2 sec and take output for 3 sec | 5% | CHX123 | 1A | 12V |
| Li-ion, MNC | LiXXXX | Sinusoid, 100 Hz, 2mA | Apply input for 2 sec and take output for 3 sec | 2% | CHX123 | 3A | 7V |
| Pb Acid | PbAAA | Sinusoid, 200 Hz, 2mA | Apply input for 12 sec and take output for 20 sec | 2% | GH5479 | 12 A | 48 V |
| Li-ion, LiFePO | LiUUUU | Sinusoid, 120 Hz, 2mA | Apply input for 5 sec and take output for 10 sec | 5% | MK9883 | 2 A | 12V |
| Ni-Cd | NI1233 | Sinusoid, 10 Hz, 2mA | Apply input for 2 sec and take output for 2 sec | 4% | CD4567 | 0.8 A | 4V |

FIG. 13

| Charger Type : CHX123 | | | |
|---|---|---|---|
| Battery ID | Recommendation | Charging Current | Charging Voltage |
| LiXXX1 | Charge | 1 A | 3.2 V < X < 3.4 V |
| LiXXX1 | Charge, Fast Charging | 3 A | 3.2 V < X < 3.4 V |
| LiXXX2 | Charge | 0.8 A | 3.5 V < X < 3.7 V |
| LiXXX2 | Charge, Slow Charge | 0.2 A | 3.2 V < X < 3.4 V |
| ... | | | |

| Data Database | | | | |
|---|---|---|---|---|
| Battery Type | Battery ID | Test Waveform | Response Waveform | Recommendation |
| Li-ion, MNC | LiXXXX | Sinusoid, 100 Hz, 2mA | Response file 1.dat | Don't Charge |
| Li-ion, MNC | LiXXXX | Sinusoid, 100 Hz, 2mA | Response file 2.dat | Charging |
| Pb Acid | PbAAA | Sinusoid, 200 Hz, 2mA | Response file 3.dat | Charge, Fast Charging |
| Li-ion, LiFePO | LiUUUU | Sinusoid, 120 Hz, 2mA | Response file 4.dat | Charge, Slow Charging |
| Ni-Cd | NI1233 | Sinusoid, 10 Hz, 2mA | Response file 5.dat | Normal Charging |

| Command Database | | |
|---|---|---|
| Battery Type | Battery ID | Commands |
| Li-ion, MNC | LiXXXX | Apply input for 2 sec and take output for 3 sec |
| Li-ion, MNC | LiXXXX | Apply input for 2 sec and take output for 3 sec |
| Pb Acid | PbAAA | Apply input for 12 sec and take output for 20 sec |
| Li-ion, LiFePO | LiUUUU | Apply input for 5sec and take output for 10 sec |
| Ni-Cd | NI1233 | Apply input for 2 sec and take output for 2 sec |

ELECTROCHEMICAL IMPEDANCE SPECTROSCOPY ANALYZER ("EISA") BATTERY PERFORMANCE DATABASE

CROSS REFERENCE TO RELATED APPLICATIONS

This application claims the benefit of priority to U.S. Provisional Patent Application Ser. No.: 62/647,236 filed Mar. 23, 2018, entitled "Electrochemical Impedance Spectroscopy Analyzer ("EISA") Battery Performance Database", the contents of which are incorporated herein by reference in their entirety.

BACKGROUND

Batteries may be susceptible to degradation from charging and discharging cycles because of the effects these factors may have on the internal chemistry of batteries. Battery degradation from charge and discharge cycles may be caused by adhesion of oxidized particles to an anode and a cathode reducing a surface area for reacting with an electrolyte, reducing an amount of the electrolyte in the battery, and increase an internal resistance of the battery. Battery degradation may result in a reduced power storage capacity, a reduced voltage output, and an increased self-discharge rate. These degradations of a battery's performance may also reduce a useful life of a battery.

SUMMARY

The systems, methods, and devices of the various embodiments enable improved charging of batteries based on analysis of electrochemical impedance spectroscopy ("EIS"), performed on a battery and compared with historical data of EIS testing on batteries. In an embodiment, EIS testing may be performed on a battery determined to be in need of charging. In an embodiment, EIS test waveforms and commands for the battery may be determined based on analysis of historical EIS testing data. In an embodiment a charging recommendation for the battery may be made based on comparison of a response waveform of the EIS testing and an EIS test waveform, and comparison of a resulting score to a range. In an embodiment, the score corresponding to a range may determine the charging recommendation associated with the range.

DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIG. 12 is a table illustrating an example charging algorithm decision matrix according to an embodiment.

FIG. 13 is a table illustrating an example EISA learned database according to an embodiment.

FIG. 14 is a table illustrating an example charger database according to an embodiment.

FIGS. 15A and 15B are tables illustrating examples of databases of an EIS system according to an embodiment.

DETAILED DESCRIPTION

Figure 1:
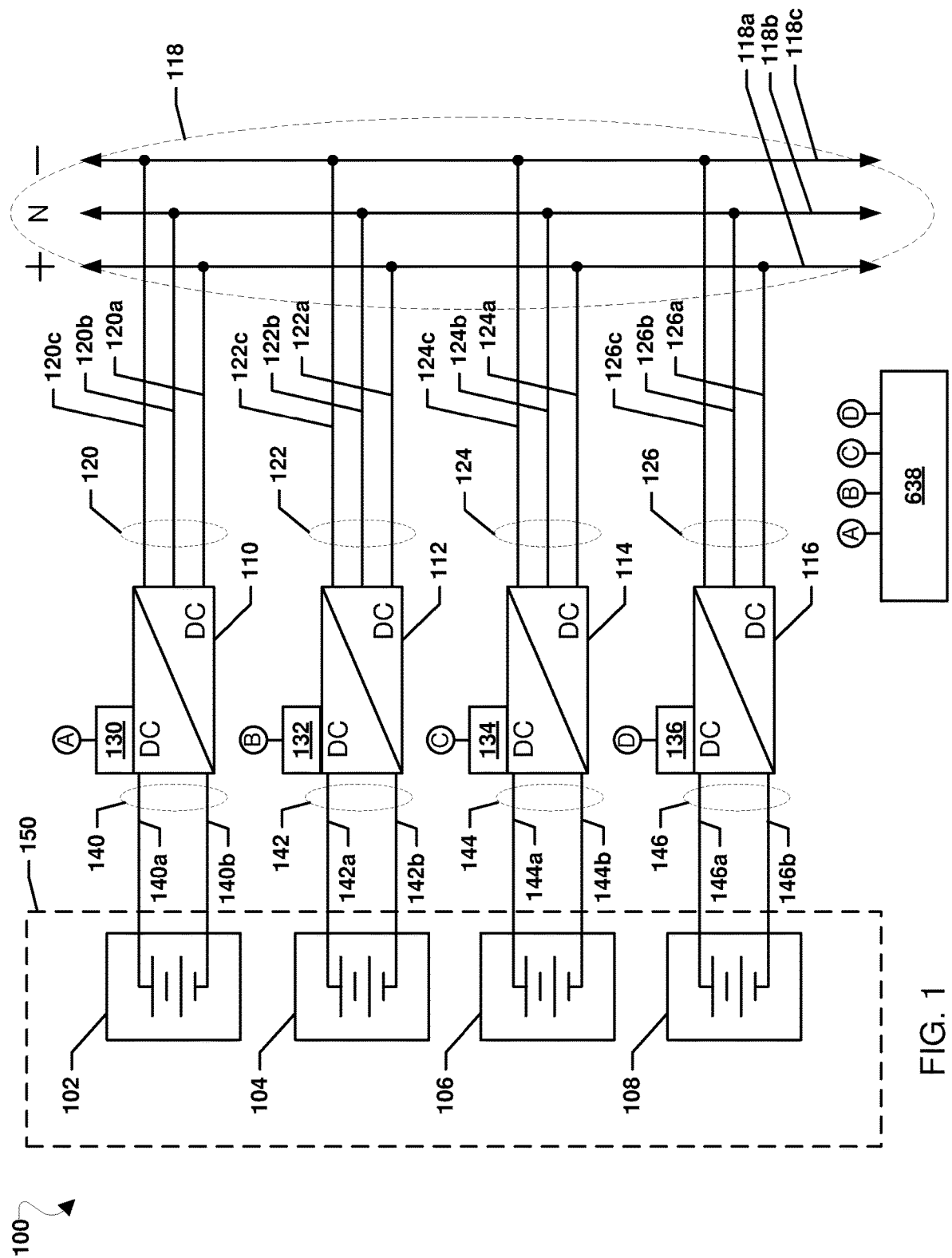
FIG. 1 is a block diagram of a system according to an embodiment.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Many types of batteries are susceptible to degradation from charging and discharging cycles, heat and cold exposure, and aging because of the effects these factors may have on the internal chemistry of batteries. For example, any one or combination of the battery degradation factors may result in deposits of oxidized particles of an electrolyte adhering to an anode and a cathode of a battery. The adhesion of the oxidized particles to the anode and the cathode may reduce a surface area of the anode and the cathode for reacting with the electrolyte, reduce an amount of electrolyte in the battery, and increase the internal resistance of the battery. Battery degradation may result in a reduced power storage capacity, a reduced voltage output, and an increased self-discharge rate. These degradations of a battery's performance may also reduce a useful life of a battery. In some embodiment, battery charging may be managed to improve efficiency, performance, and/or longevity of batteries.

The systems, methods, and devices of the various embodiments enable electrochemical impedance spectroscopy (EIS) (also called AC impedance spectroscopy) to be performed on batteries by power electronics connecting the batteries in parallel to a common load and/or bus. As used herein, the term "battery" refers to any rechargeable wet cell battery, rechargeable dry cell battery, and rechargeable solid state battery, and may include a battery pack, a battery stack, and a battery cell.

EIS enables the overall impedance of a battery to be determined by measuring a voltage or current across the battery at varying sampling frequencies. A test waveform selected to achieve the varying sampling frequencies, such as a waveform with oscillations of approximately 1 Hz, may be generated on a line connected to the battery, for example by rapid switching of the line to load and unload the battery, thereby injecting the test waveform into the battery. The test waveform may be a sine wave or other type wave selected to achieve desired sampling frequencies. A voltage or current and resulting phase angle of the battery may be determined at each of the sampling frequencies, and using EIS converted into impedances.

Results of the EIS procedure (e.g., the impedance at varying frequencies) may be graphically represented using a Nyquist plot or Bode plot and characteristics of the battery may be determined based on the impedance response of the battery. By comparing the impedance response of the battery being measured to known signatures of impedance responses of batteries with known characteristics, the characteristics of the measured device may be identified. Characteristics of the battery that may be determined based at least in part on the impedance response include charge conditions (e.g., state of charge), anode conditions, and cathode conditions. Based on the determined characteristics of the battery, a charging operation may be conducted and/or a charging rate of the battery may be adjusted. Additionally, determined characteristics of the battery may be compared to a failure threshold, and when the characteristics exceed the failure threshold, a failure mode of the battery may be indicated, such as a buildup of non-conductive compounds on the anode or cathode, dendritic breakdown of the electrolyte, etc.

In an embodiment, correlations of impedance responses of various types of batteries to charge state and/or various failure modes may be discovered by collecting in data sets the impedance responses (i.e., EIS data) of various batteries along with other indications of charge state and/or failure modes, and then using such data sets to train a learning algorithm (e.g., an artificial intelligence (AI) or neural network model) to create a learned database (i.e., an EIS database) that can be used by an Electrochemical Impedance Spectroscopy Analyzer (EISA). In some embodiments, such a learned database may comprise stored plots of impedance responses and/or stored impedance values of similar batteries correlated with known characteristics. By collecting data from many batteries operating under different operating conditions and charging/discharging profiles, a learned database of battery characteristics can be created that may be generally useful by an EISA for monitoring or diagnosing battery systems encompassing a wide range of battery applications. A learned database may be created for each of a variety of battery types. Further, the process of collecting information on impedance responses of batteries to and charge state and/or failure modes for various types of batteries using such data sets to train a learning algorithm may be performed continuously or periodically so as to refine the learned databases over time. The collection of battery impedance responses (i.e., EIS data), charge state and failure mode and the creation and refinement of learned databases may be performed in a centralized service, such as an EISA network, which may make the learned EISA databases available to EIS systems via a network (e.g., the Internet). In some embodiments, such an EISA network may be cloud-based.

In an embodiment, the power electronics connected to each battery of a group of two or more batteries may compensate for any ripple generated during EIS such that no ripple or a reduced ripple is realized at the common load and/or bus. As one power electronics injects the test waveform into its respective battery, a resulting ripple from that power electronics may be applied to the load and/or bus. To counteract this ripple from the power electronics performing EIS monitoring, an offsetting (or canceling) ripple or ripples may be generated by one or more of the other power electronics. To generate the offsetting (or canceling) ripple or ripples one or more of the other power electronics not presently performing EIS monitoring may inject an offset waveform toward their respective battery resulting in an offsetting ripple being applied to the common load and/or bus connected in parallel to the batteries. The sum of the ripple from the power electronics performing EIS monitoring and the offsetting ripple or ripples from the one or more other power electronics may be a DC output resulting in little or no ripple at the load and/or common bus.

In another embodiment, other devices connected to the common load and/or bus may compensate for any ripple generated during EIS such that no ripple or a reduced ripple is realized at the common load and/or bus. As discussed above, as one power electronics injects the test waveform into its respective battery, a resulting ripple from that power electronics may be applied to the load and/or bus. To counteract this ripple from the power electronics performing EIS monitoring, an offsetting (or canceling) ripple or ripples may be generated by one or more other device, such as a waveform generator, and injected into the common load and/or bus. To generate the offsetting (or canceling) ripple or ripples one or more other device may apply an offset ripple to the common load and/or bus connected in parallel to the batteries. The sum of the ripple from the power electronics performing EIS monitoring and the offsetting ripple or ripples applied by the other device may be a DC output resulting in little or no ripple at the load and/or common bus.

In an embodiment, during EIS monitoring the impedance of a segment may be determined as the polar form voltage of the segment over the polar form current of the segment. This may enable a Fourier series calculation to be used to allow for analysis of an imperfect sinusoidal ripple at the fundamental frequency without needing to calculate a full Fast Fourier Transform. This may increase the accuracy of the impedance calculation and decrease the processing time required to determine an impedance response in comparison to impedance determinations made using a full Fast Fourier Transform.

In an embodiment, energy storage devices may be included on the power electronics connected to each battery. Energy storage devices may be any type energy storage devices, such as capacitors, supercapacitors, batteries, etc. In various embodiments, the energy storage devices may be on the output, the input, or windings of the transformer of the power electronics to store ripple energy and discharge the ripple energy out of phase. The energy storage device may reduce the ripple current, or eliminate the ripple current, passing to the bus. The ability to reduce and/or eliminate the ripple current resulting from EIS testing may enable EIS testing using test waveforms with higher frequencies than may be used without the energy storage devices. For example, test waveforms with frequencies at or above 400 Hz may be used, greatly extending the bandwidth of the power electronics to create and analyze test waveforms. Without the energy storage devices, the bandwidth of the test waveform frequencies may be practically limited to frequencies less than the switching frequency of the power electronics. With the energy storage devices, the bandwidth of the test waveform frequencies may extend to frequencies greater than the switching frequency of the power electronics.

In a specific embodiment, the batteries may be one or more battery stack segments, such as one, two, three, four, or more battery stack segments, and the power electronics devices may be DC to DC converters. The battery stack segments may be any type of rechargeable batteries.

FIG. 1 is a block diagram of a system 100 according to an embodiment. The system 100 may include any number of batteries 102, 104, 106, and 108. For example, the batteries 102, 104, 106, and 108 may each be battery stack segments of battery packs or battery assemblies that may constitute a portion of a power module 150. Each battery 102, 104, 106, and 108 may be electrically connected via a respective input connection 140, 142, 144, and 146 to a respective one of power electronics 110, 112, 114, and 116. Each input connection 140, 142, 144, and 146 may comprise a respective positive input connection 140a, 142a, 144a, and 146a as well as a respective negative input connection 140b, 142b, 144b, and 146b. In operation, the batteries 102, 104, 106, and 108 may output DC voltages to their respective power electronics 110, 112, 114, and 116 via their respective input connections 140, 142, 144, and 146.

The power electronics 110, 112, 114, and 116 may be DC to DC converters, for example 380 volt 23 amp DC to DC converters. The power electronics 110, 112, 114, and 116 may be each include controllers 130, 132, 134, and 136, respectively, each connected, wired or wirelessly, to a central controller 138. The controllers 130, 132, 134, and 136 may be processors configured with processor-executable instructions to perform operations to control their respective power electronics 110, 112, 114, and 116, and the controller 138 may be a processor configured with processor-executable instructions to perform operations to exchange data with and control the operations of power electronics 110, 112, 114, and 616 via their respective controllers 130, 132, 134, and 136. Via the connections A, B, C, and D between the controllers 130, 132, 134, 136 connected to the power electronics 110, 112, 114, and 116 and the controller 138, the controller 138 may be effectively connected to the power electronics 110, 112, 114, and 116 and control the operations of the power electronics 110, 112, 114, and 116.

The power electronics 110, 112, 114, and 116 may be connected in parallel to a DC bus 118 by their respective output connections 120, 122, 124, and 126. In an embodiment, the DC bus 118 may be a three phase bus comprised of a positive line 118a, a neutral line 118b, and a negative line 118c, and the respective output connections 120, 122, 124, and 126 may include respective positive output connections 120a, 122a, 124a, and 126a, respective neutral output connections 120b, 122b, 124b, and 126b, and respective negative output connections 120c, 122c, 124c, and 126c. In operation, the power electronics 110, 112, 114, and 116 may output DC voltages to the bus 118 via their respective output connections 120, 122, 124, and 126. In an embodiment, power electronics 110, 112, 114, and 116 may be three phase converters configured to receive positive and negative DC inputs from their respective batteries 102, 104, 106, and 108 and output positive DC, negative DC, and neutral outputs to the bus 118 via their respective positive output connections 120a, 122a, 124a, and 126a, respective neutral output connections 120b, 122b, 124b, and 126b, and respective negative output connections 120c, 122c, 124c, and 126c. In an alternative embodiment, power electronics 110, 112, 114, and 116 may each be comprised of dual two phase converters. The positive output of the first of the two phase converters may be connected to the positive line 118a of the bus 118 and the negative output of the second of the two phase converters may be connected to the negative line 118c of the bus 118. The negative output of the first of the two phase converters and the positive output of the second of the two phase converters may be connected together to the neutral line 118b of the bus 118.

In an embodiment, the power electronics 110, 112, 114, and 116 may each be configured to perform EIS monitoring of their respective battery 102, 104, 106, and 108. The controller 138 may select a test waveform for use in EIS monitoring for one of the batteries 102, 104, 106, or 108, and may control that power electronics 110, 112, 114, or 116 of that battery 102, 104, 106, or 108 to inject the selected test waveform onto the respective input connection 140, 142, 144, or 146. For example, the controller 138 may send an indication of the selected test waveform to the controller 130 of power electronics 110 to cause opening and closing of a switch at the power electronics 110 to generate the selected test waveform via pulse width modulation on the input connection 140 of connected to the battery 102. The power electronics 110, 112, 114, or 116 injecting the test waveform may be configured to monitor the resulting impedance response of its respective battery 102, 104, 106, or 108, and via its respective controller 130, 132, 134, or 136 may output an indication of the monitored impedance response to the controller 138. Continuing with the preceding example, power electronics 110 may monitor the impedance response on the input connection 140 to the battery 102 and the controller 130 may indicate the impedance response of battery 102 to the controller 138.

The controller 138 may use the impedance response determined by EIS monitoring of a battery 102, 104, 106, 108 to determine a characteristic of that battery 102, 104, 106, 108 and may adjust a setting of the system 100 based on the determined characteristic. For example, the controller 138 may determine the impedance response according to method 500 described further below with reference to FIG. 5. The controller 138 may compare the impedance response determined by EIS monitoring of a battery 102, 104, 106, 108, such as a plot of the impedance response and/or stored impedance values, to impedance responses stored in a memory, such as stored plots of impedance responses and/or stored impedance values, of similar batteries correlated with known characteristics. The controller 138 may compare the impedance response determined by EIS monitoring of a battery 102, 104, 106, 108 to the stored impedance responses in any manner to identify matches between the impedance responses determined by EIS monitoring of a battery 102, 104, 106, 108 and the stored impedance responses.

When the controller 138 determines a match (e.g., identically or within some predetermined variance value) between the impedance response determined by EIS monitoring of a battery 102, 104, 106, 108 and a stored impedance response, the controller 138 may determine the characteristic correlated with the stored impedance response to be the characteristic of the respective battery 102, 104, 106, 108. For example, EIS monitoring may enable determined characteristics of the batteries 102, 104, 106, or 108 to be compared to charge state characteristics to determine an amount of charge stored in the batteries or whether charging of the batteries is indicated, and a suitable charging operation may be scheduled or commenced. As another example, EIS monitoring may enable determined characteristics of the batteries 102, 104, 106, or 108 to be compared to a failure threshold, and when the characteristics exceed the failure threshold a failure mode of the battery 102, 104, 106, or 108 may be indicated or determined, such as cathode or anode degradation, dendritic degradation of the electrolyte, chemical breakdown of the electrolyte, etc. Based on an indicated or determined failure mode, a suitable response may be indicated or taken, such as adjusting charging and discharging usage of one or more batteries 102, 104, 106, or 108 to extend the useful life of the power assembly 150, adjusting a charging rate and/or a discharging rate to slow or limit further battery degradation, performing a maintenance cycle on one or more of the batteries 102, 104, 106, or 108 (e.g., a deep discharge followed by full recharge), isolating one of the batteries 102, 104, 106, or 108 to prevent failure, and/or indicating that one or more batteries 102, 104, 106, or 108 are reaching end of life and should be replaced. Actions taken in response to an indicated or determined failure mode.

When a test waveform is injected on an input connection 140, 142, 144, or 146 by a respective power electronics 110, 112, 114, or 116 to perform EIS monitoring, a ripple on the respective output connection 120, 122, 124, or 126 may occur. If unaccounted for, the resulting ripple from the power electronics 110, 112, 114, or 116 performing EIS monitoring may cause an undesired ripple on the DC bus 118. To prevent a ripple on the DC bus 118, the ripple from the power electronics 110, 112, 114, or 116 performing EIS monitoring may be offset or canceled by other ripples injected into the DC bus 118. In an embodiment, the other ripples may be generated by one or more of the other power electronics 110, 112, 114, or 116 not performing EIS monitoring. The ripples from one or more of the other power electronics 110, 112, 114, or 116 not performing EIS monitoring may be generated by controlling the one or more of the other power electronics 110, 112, 114, or 116 not performing EIS monitoring to inject an offset waveform into their respective input connections to their respective input connections 140, 142, 144, or 146. The offset waveform or waveforms may be selected by the controller 138 such that the ripples on the respective output connections 120, 122, 124, or 126 generated in response to injecting the offset waveform or waveforms cancels the ripple caused by the power electronics 110, 112, 114, or 116 performing EIS monitoring when the waveforms are summed at the DC bus 118. In another embodiment, ripples may be injected into output connections 120, 122, 124, or 126 from devices other than the power electronics 110, 112, 114, or 116 to cancel the ripple caused by the power electronics 110, 112, 114, or 116 performing EIS monitoring when the waveforms are summed at the DC bus 118. For example, a waveform generator may be connected to output connections 120, 122, 124, or 126 to inject canceling ripples in response to EIS monitoring.

Figure 2A:
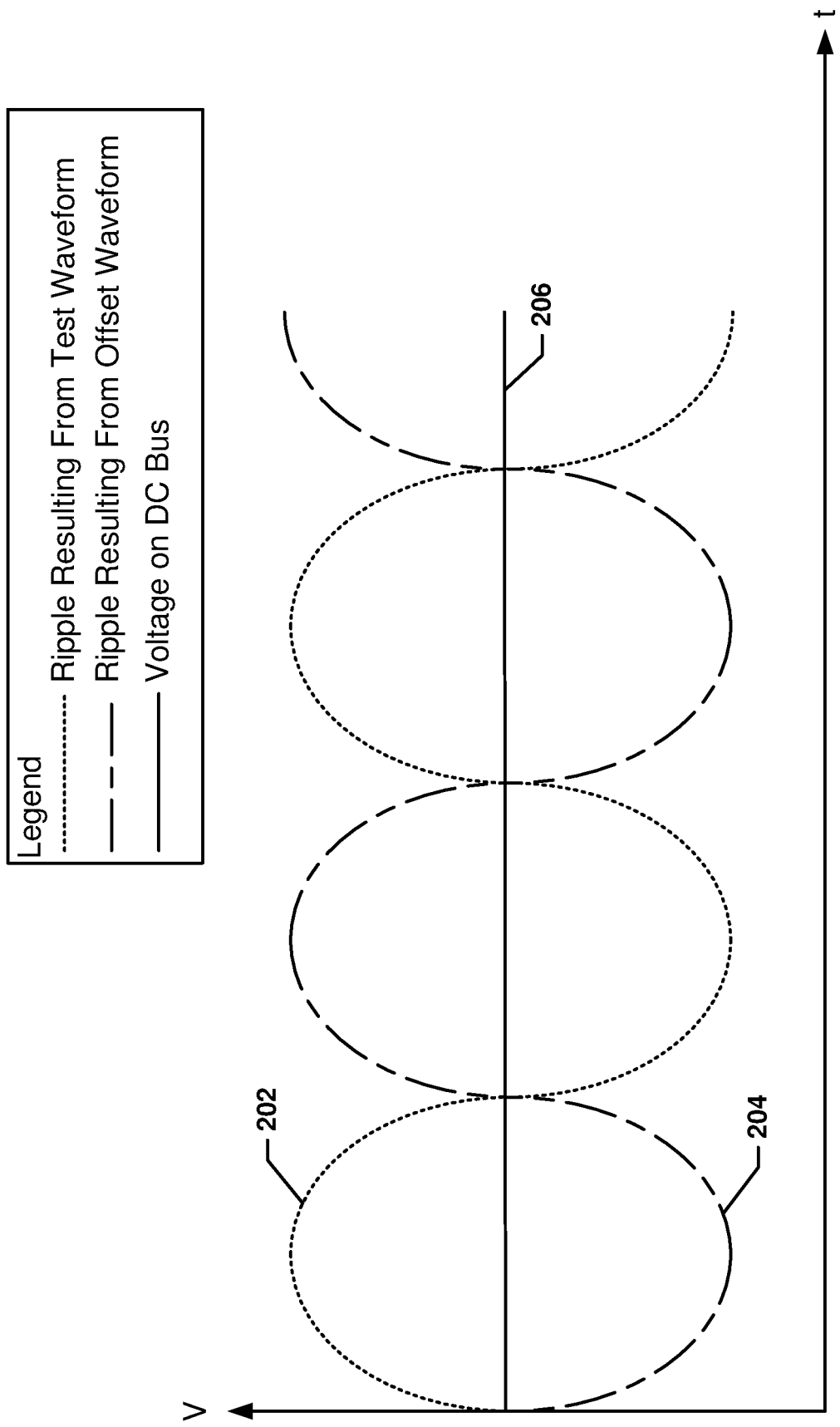
FIGS. 2A and 2B are graphs illustrating canceling ripples on a DC bus over time.

FIG. 2A is a graph illustrating canceling ripples on a DC bus over time. A test waveform injected onto an input connection of a battery by a power electronics may result in a ripple 202 sent from the power electronics injecting the test waveform toward a DC bus. An offset waveform injected onto an input connection of another battery by another power electronics may result in a ripple 204 sent from that power electronics injecting the offset waveform toward the DC bus. The offset waveform may be selected such that the ripple 204 is 180 degrees out of phase with the ripple 202. The power electronics may be connected to the DC bus in parallel and the sum of the ripple 202 and the ripple 204 may cancel each other out such that the sum of the waveforms is the desired DC voltage 206 on the DC bus.

Figure 2B:
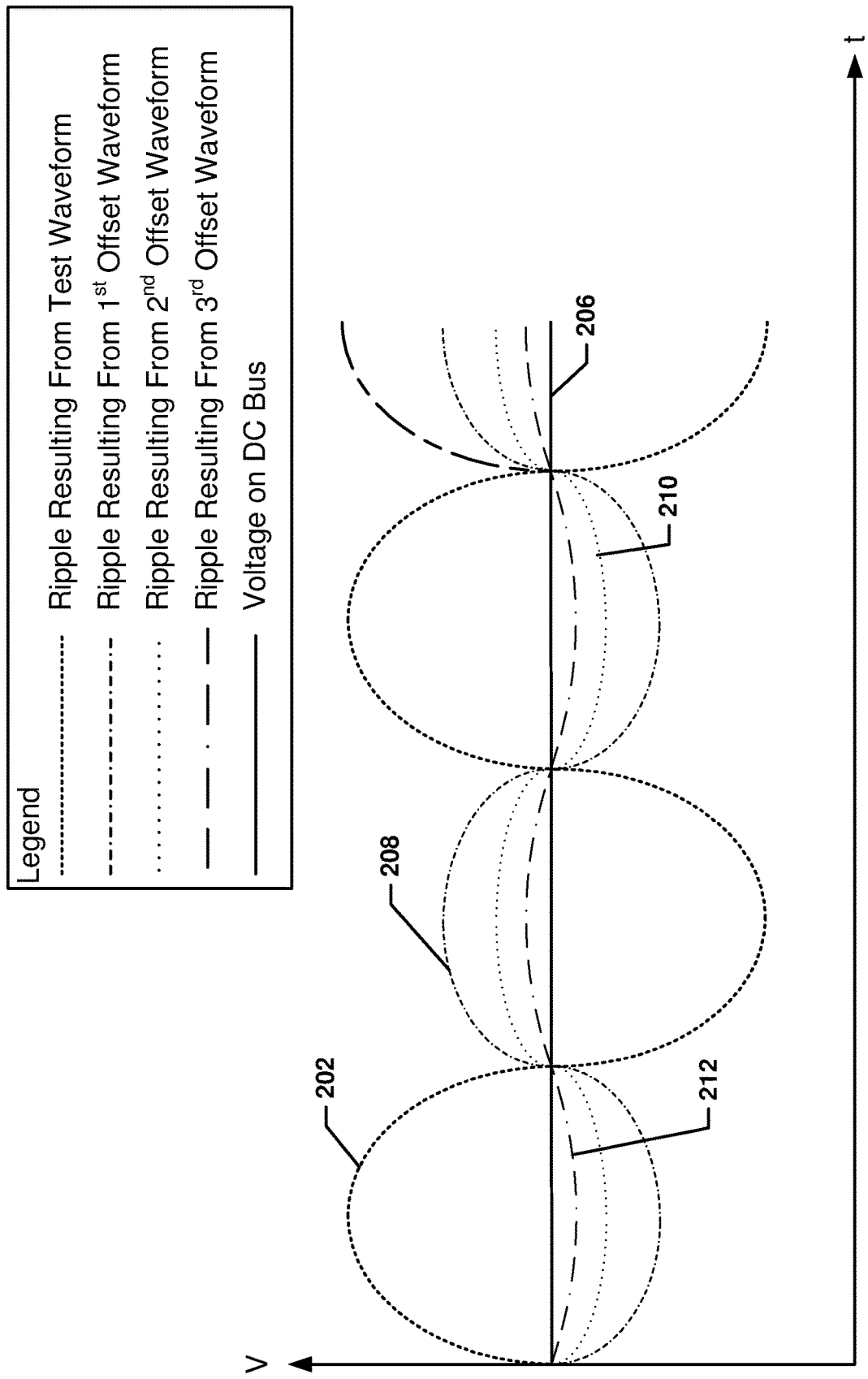

FIG. 2B is another graph illustrating canceling ripples on a DC bus over time using more than one offsetting waveform. As discussed above, a test waveform injected onto an input connection of a battery by a power electronics may result in a ripple 202 sent from the power electronics injecting the test waveform toward a DC bus. Three other power electronics may be used to generate offset waveforms injected onto input connections of three other batteries. The first offset waveform injected onto an input connection of a first other battery by the first other power electronics may result in a ripple 208 sent from that first other power electronics injecting the offset waveform toward the DC bus. The second offset waveform injected onto an input connection of a second other battery by the second other power electronics may result in a ripple 210 sent from that second other power electronics injecting the offset waveform toward the DC bus. The third offset waveform injected onto an input connection of a third other battery by the third other power electronics may result in a ripple 212 sent from that third other power electronics injecting the offset waveform toward the DC bus. The three offset waveforms may be selected such that the sum of the ripples 208, 210, and 212 may cancel ripple 202 such that the sum of the waveforms is the desired DC voltage 206 on the DC bus. While illustrated in FIGS. 2A and 2B as one generated offsetting ripple 204 or three offsetting ripples 208, 210, 212 with the same frequency as the ripple 202, more or less offsetting ripples, with different waveforms, different frequencies, phases, amplitudes, etc. may be generated and injected toward the DC bus as long as the total of any offsetting ripples plus the ripple 202 sent from the power electronics injecting the test waveform toward the DC bus results in the desired DC voltage 206 on the DC bus with no ripple.

Figure 3:
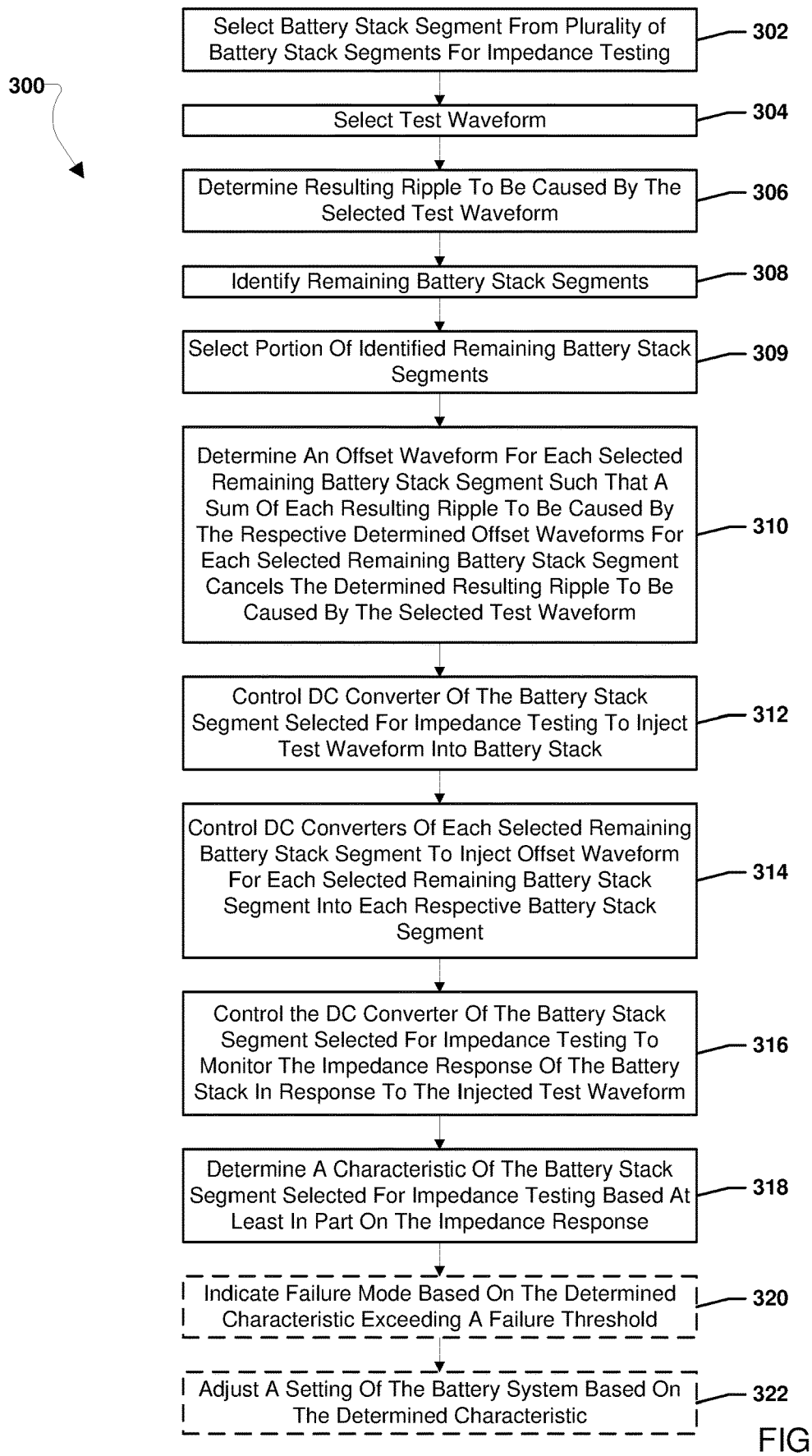
FIG. 3 is a process flow diagram illustrating an embodiment method for canceling the ripple to a DC bus caused by a test waveform.

FIG. 3 illustrates an embodiment method 300 for performing an EIS procedure on a battery stack. In an embodiment, the operations of method 300 may be performed by a controller, such as controller 138. The operations of method 300 are discussed in terms of battery stack segments and DC converters, but battery stack segments and converters are used merely as examples. Other batteries and/or other power electronics may be used in the various operations of method 300.

In block 302, the controller 138 may select a battery stack segment from a plurality of battery stack segments for impedance testing. For example, the battery stack segment may be selected based on a testing protocol governing when and in what order battery stack segments may be tested. In block 304 the controller 138 may select a test waveform. The test waveform may be selected to generate necessary oscillations for EIS monitoring, such as oscillations of approximately 1 Hz.

In block 306, the controller 138 may determine a resulting ripple to be caused by the selected test waveform. As discussed above, the resulting ripple may be the ripple output to the DC bus from the DC converter injecting the test waveform. In block 308 the controller 138 may identify the remaining battery stack segments. The remaining battery stack segments may be the battery stack segments not selected for impedance testing. In block 310 the controller 138 may select a portion of the identified remaining battery stack segments. In an embodiment, the selected portion may be all identified remaining battery stack segments. In another embodiment, the selected portion may be less than all identified remaining battery stack segments, such as only a single identified remaining battery stack segment.

In block 310, the controller 138 may determine an offset waveform for each selected remaining battery stack segment such that a sum of each resulting ripple to be caused by the respective determined offset waveforms for each selected remaining battery stack segment cancels the determined resulting ripple to be caused by the selected test waveform. In an embodiment, each offset waveform may be generated such that the resulting ripple is the same, such as one, two, three or more equal ripples that together cancel the ripple from the test waveform. In another embodiment, each offset waveform may be generated such that the resulting ripples are different, such as two, three, or more different ripples that together cancel the ripple from the test waveform.

In block 312, the controller 138 may control the DC converter of the battery stack segment selected for impedance testing to inject the test waveform into the battery stack. For example, the controller 138 may send control signals to a controller (e.g., 130, 132, 134, or 136) of the DC converter to cause the converter to perform pulse width modulation to generate the test waveform on an input connection to the battery stack segment.

In block 314, the controller 138 may control the DC converters of each selected remaining battery stack segment to inject the offset waveform for each selected remaining battery stack segment into each respective battery stack segment. For example, the controller 138 may send control signals to the controllers (e.g., 130, 132, 134, and/or 136) of the DC converters to cause the converters to perform pulse width modulation to generate the offset waveforms on an input connection to their respective battery stack segments.

The operations of the method 300 performed in blocks 312 and 314 may occur simultaneously, such that the test waveform and offset waveforms are injected at the same time resulting in ripples being output from the various DC converters that cancel each other out resulting in a desired DC voltage on the DC bus.

In block 316, the controller 138 may control the DC converter of the battery stack segment selected for impedance testing to monitor the impedance response of the battery stack in response to the injected test waveform. For example, the controller 138 may monitor the voltage and current response of the segment and determine the impedance according to method 500 described below with reference to FIG. 5.

In block 318, the controller 138 may determine a characteristic of the battery stack segment selected for impedance testing based at least in part on the impedance response. For example, the controller may use EIS monitoring to plot the real and imaginary parts of the measured impedances resulting from the injected test waveform and compare the plotted impedances to the known signatures of impedance responses of battery stack segments with known characteristics. The known signatures of impedance responses of the battery stack segments with known characteristics may be stored in a memory available to the controller (e.g., from a learned EIS database provided by an EISA network deployed in the cloud). The stored known signatures of impedance responses of the battery stack segments with known characteristics may be plots of the real and imaginary parts of the measured impedances of healthy battery stack segments and damaged/degraded battery stack segments derived from testing healthy (i.e., undamaged/undegraded) and damaged/degraded battery stack segments with various forms of damage (e.g., anode cracking) and/or degradation (e.g., segments operating in fuel starvation mode). The known characteristics may be correlated with the plots of the real and imaginary parts of the measured impedances stored in the memory. By matching the measured impedances to the known signatures of impedance responses, the current characteristics or state of the battery stack may be determined as those characteristics correlated with the matching known signature of impedance response.

In optional block 320, the controller 138 may indicate a failure mode based on the determined characteristic exceeding a failure threshold. For example, if the determined characteristic exceeds a failure threshold a failure mode of the battery stack may be indicated.

In optional block 322, the controller 138 may adjust a setting of the battery system based on the determined characteristic. For example, the controller 138 may initiate charging adjust a charging or discharging rate (e.g., increase or decrease), or shut off of the battery system based on the determined characteristic. In this manner, impedance testing, such as EIS monitoring, may be used in a battery system to adjust the operation of the battery system based on current characteristics of the battery stack segments.

Figure 4:
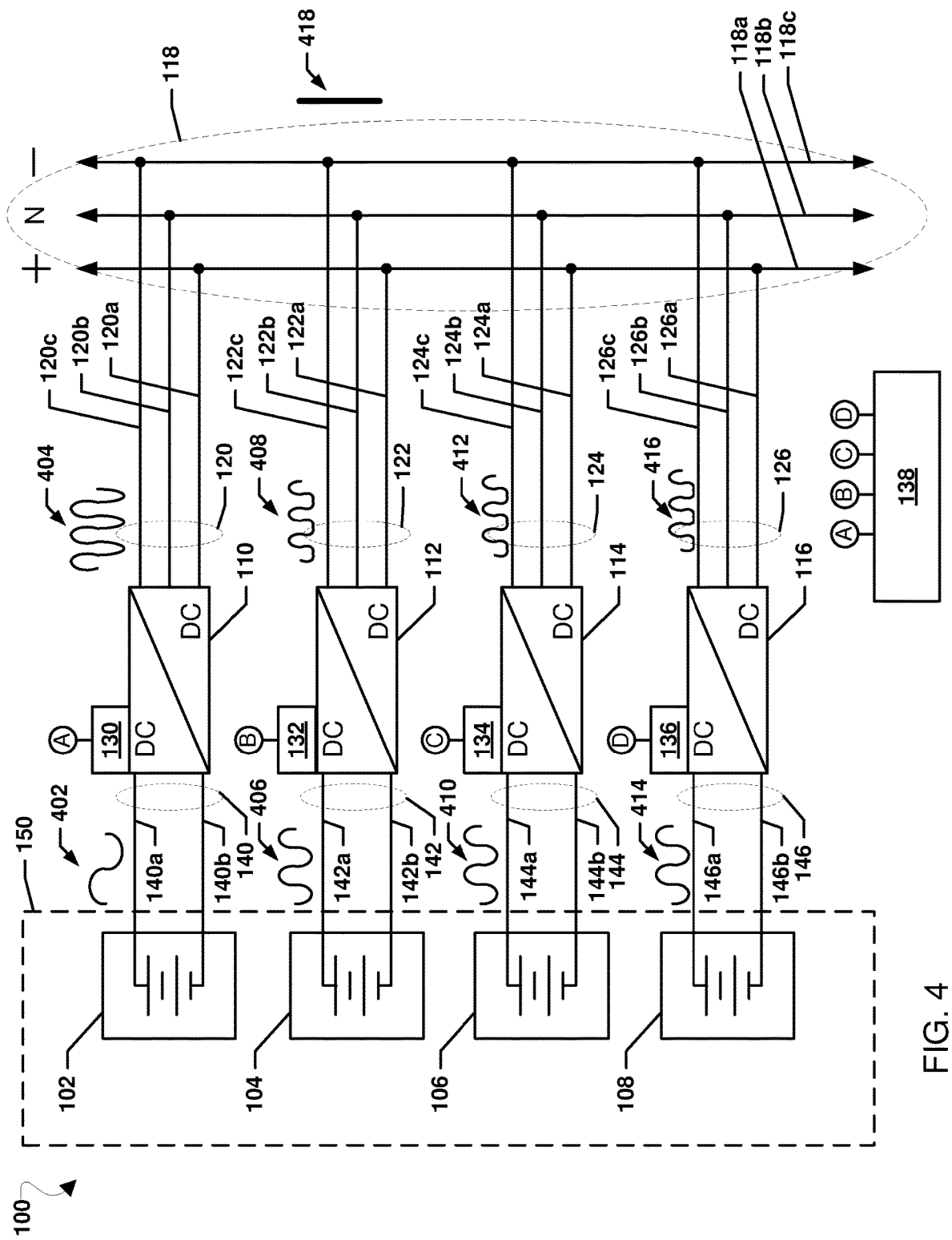
FIG. 4 is a block diagram of a system illustrating injected waveforms and resulting canceling ripples according to an embodiment.

FIG. 4 is a block diagram of the system 100 described above with reference to FIG. 1, illustrating injected waveforms 402, 406, 410, and 414 and resulting canceling ripples 404, 408, 412, and 416 according to an embodiment. A test waveform 402 may be injected into the input connection 140 resulting in a ripple 404 on the output connection 120 to the DC bus 118. An offset waveform 406 may be injected into the input connection 142 resulting in an offset ripple 408 on the output connection 122 to the DC bus 118. An offset waveform 410 may be injected into the input connection 144 resulting in an offset ripple 412 on the output connection 124 to the DC bus 118. An offset waveform 414 may be injected into the input connection 146 resulting in an offset ripple 416 on the output connection 126 to the DC bus 118. The sum of the ripples 404, 408, 412, and 416 may be such that steady DC voltage 418 without a ripple occurs on the DC bus 118 despite AC ripples occurring on the output connections 120, 122, 124, and 126. While the sum of the ripples 404, 408, 412, and 416 may be such that steady DC voltage 418 without a ripple results on the DC bus 118, the sum of the offset waveforms 406, 410, and 414 and the test waveform 402 need not equal zero. The offset ripples 408, 412, and 416 may all be the same or may be different. For example, offset ripple 408 may be a larger ripple than offset ripples 412 and 416. Additionally, whether or not the offset ripples 408, 412, and 416 are the same or different, the offset waveforms 406, 410, and 414 may not be the same. While three offset waveforms 406, 410, and 414 and their resulting offset ripples 408, 412, and 416 are illustrated, less offset waveforms and offset ripples, such as only two offset waveforms and resulting offset ripples or only one offset waveform and one resulting offset ripple, may be generated to offset the ripple 404.

In an alternative embodiment, the offset ripples 408, 412, and/or 416 may be generated by other devices, such as waveform generators, connected to output connections 122, 124, 126, and controlled by the controller 138, rather than the power electronics 112, 114, and/or 116. The offset ripples 408, 412, and/or 416 may be generated by the other devices such that the sum of the ripples 404, 408, 412, and 416 may be the steady DC voltage 418 without a ripple on the DC bus 118. Additionally, combinations of ripples generated by the power electronics 112, 114, and/or 116 and the other devices, such as additional waveform generators, may be used to cancel the ripple 404 resulting in the steady DC voltage 418 without a ripple on the DC bus 118.

Figure 5:
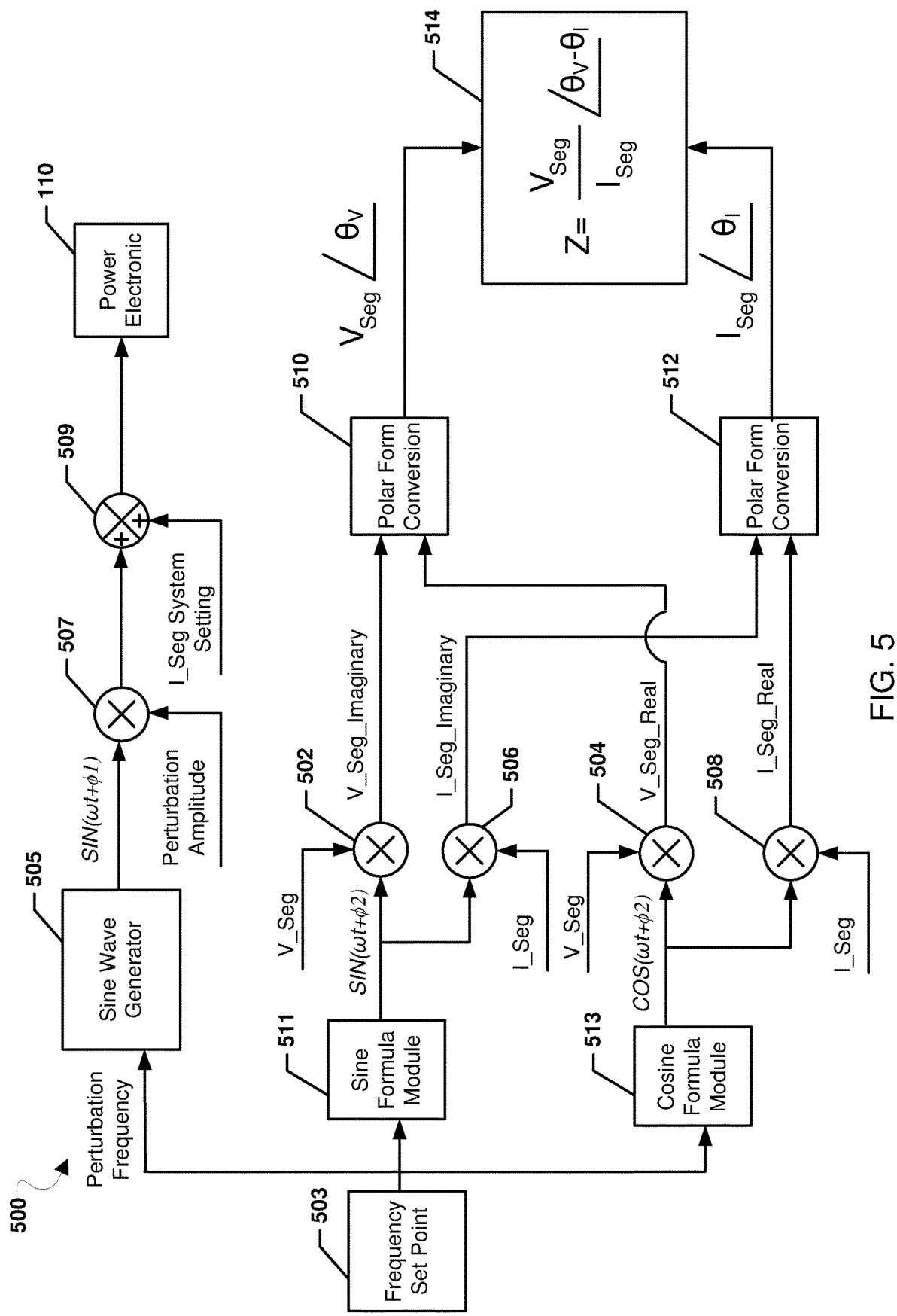
FIG. 5 is a process flow diagram illustrating an embodiment method for determining an impedance response for a battery segment.

FIG. 5 is a system block diagram illustrating a waveform generator 500 for generating wave forms for performing EIS monitoring of a battery segment. The elements of the waveform generator 500 are discussed in terms of battery stack segments and DC converters, but battery stack segments and converters are used merely as examples. Other batteries and/or other power electronics may be used in the various operations of method 500. In an embodiment, the waveform generator 500 may operate in conjunction with the operations of method 300 described above with reference to FIG. 3.

In an input 503 the controller 138 may input a frequency set point (f) for a particular EIS monitoring process. The frequency set point may be output to a sine wave generator 505 as the perturbation frequency. The sine wave generator 505 may output a waveform SIN($\omega$t+$\phi$1) in which $\omega$ is the fundamental frequency (2$\pi$f) and $\phi$1 is the phase angle. In multiplier circuit 507 the output waveform multiplied by the perturbation amplitude, and the result may be added to the segment set as a system setting (I_Seg System Setting) in adder circuit 509 to generate a test waveform that may be sent to the power electronic 110 for injecting the waveform into the battery segment. The current for the segment set as a system setting may be a current setting provided from the controller 138 or another controller as a target current setting for the battery segment. The power electronic 110 illustrated in FIG. 5 may be any one of the power electronics 110, 112, 114, or 116 and similar operations may be performed to control power electronics 112, 114, and 116 to inject test waveforms.

The frequency set point may also be output to a sine formula module 511 and a cosine formula module 513. The sine formula module 511 may output a waveform SIN($\omega$t+$\phi$2) in which $\omega$ is the fundamental frequency (2$\pi$f) and $\phi$2 is the phase angle. The cosine formula module 513 may output a waveform COS($\omega$t+$\phi$2) in which $\omega$ is the fundamental frequency (2$\pi$f) and $\phi$2 is the phase angle.

In multiplier circuit 502 the output waveform from the sine formula module 511 may be multiplied with the voltage of the segment (V_Seg) to determine the imaginary voltage component of the segment (V_Seg_Imaginary). In multiplier circuit 506 the output waveform from the sine formula module 511 may be multiplied with the current of the segment (I_Seg) to determine the imaginary current component of the segment (I_Seg_Imaginary).

In multiplier circuit 504 may multiply the output waveform from the cosine formula module 513 with the voltage of the segment (V_Seg) to determine the real voltage component of the segment (V_Seg_Real). In multiplier circuit 508 the output waveform from the cosine formula module 513 may be multiplied with the current of the segment (I_Seg) to determine the real current component of the segment (I_Seg_Real).

Module 510 and 512 may respectively convert the real and imaginary components of the voltage of the segment and the real and imaginary components of the current of the segment to polar form voltage of the segment and polar form current of the segment.

Module 514 may determine the impedance "Z" of the segment as the polar form voltage of the segment over the polar form current of the segment. In this manner, the waveform generator 500 may enable a Fourier series calculation to be used to allow for analysis of an imperfect sinusoidal ripple at the fundamental frequency without needing to calculate a full Fast Fourier Transform. This may increase the accuracy of the impedance calculation and decrease the processing time required to determine an impedance response in comparison to impedance determinations made using a full Fast Fourier Transform.

Figure 6:
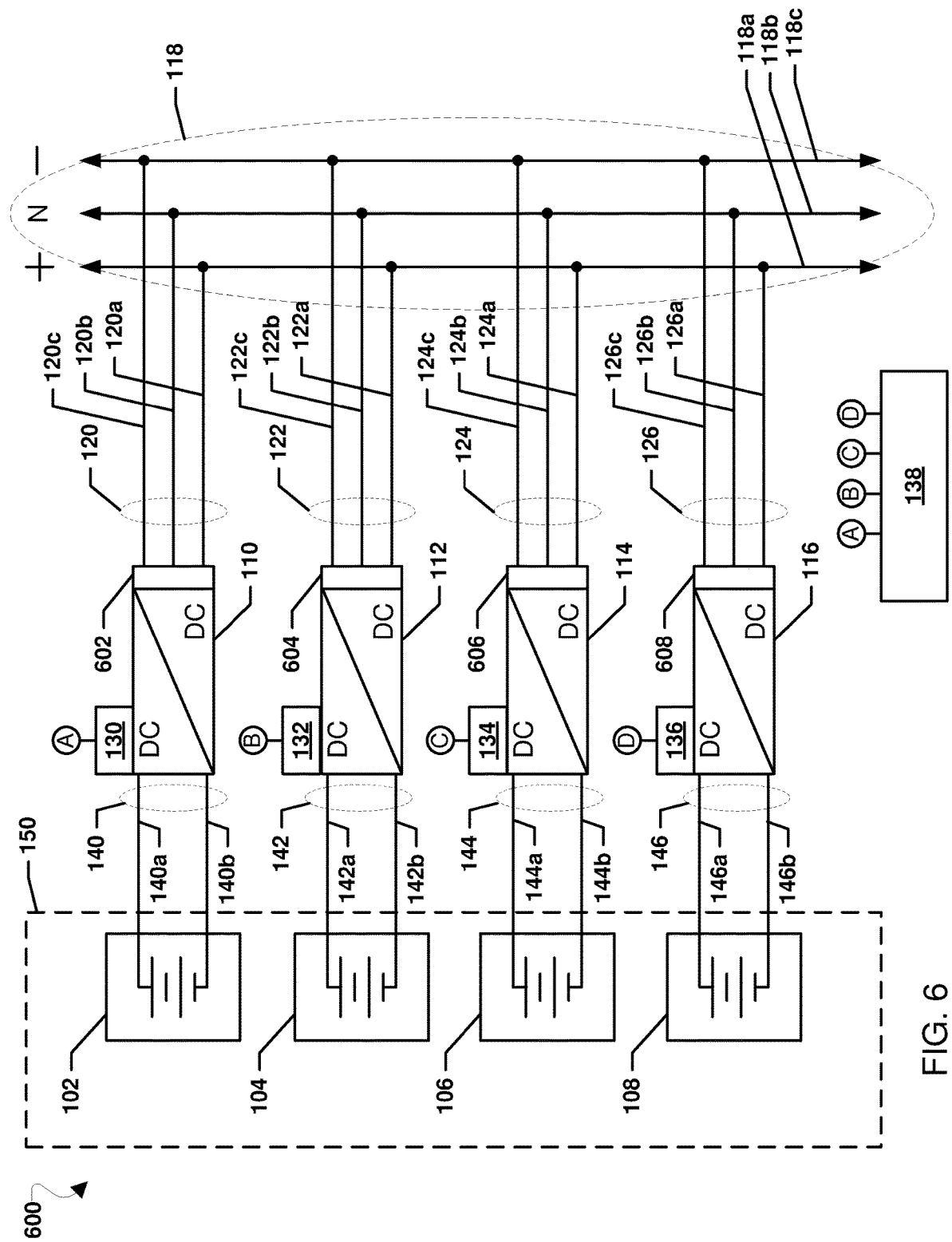
FIG. 6 is a block diagram of a system according to another embodiment.

FIG. 6 is a block diagram of a system 600 according to another embodiment. The system 600 is similar to system 100 illustrated in FIG. 1 and includes a number of components in common. Those components which are common to both systems 100 and 600 are numbered with the same numbers in FIGS. 1 and 6 and will not be described further.

The system 600 is similar to the system 100 described above with reference to FIG. 1, except that energy storage devices 602, 604, 606, and 608 may be included on the power electronics 110, 112, 114, and 116, respectively. Energy storage devices 602, 604, 606, and 608 may be any type of energy storage devices, such as capacitors, supercapacitors, batteries, etc. In an embodiment, the energy storage devices 602, 604, 606, and 608 may be on the output of their respective power electronics 110, 112, 114, and 116 to store ripple energy and discharge the ripple energy out of phase. The discharge out of phase by an energy storage device 602, 604, 606, or 608 may provide cancellation of the ripple current output on the respective output connection 120, 122, 124, or 126 to the DC bus 118 as a result of a test waveform injected into the input connection of the power electronic 110, 112, 114, or 116 associated with that energy storage device 602, 604, 606, or 608. In this manner, the energy storage device 602, 604, 606, or 608 may reduce the ripple current, or eliminate the ripple current, passing to the DC bus 118. The ability to reduce and/or eliminate the ripple current resulting from EIS testing may enable EIS testing using test waveforms with higher frequencies than may be used without the energy storage devices 602, 604, 606, or 608. For example, test waveforms with frequencies at or above 400 Hz may be used, greatly extending the bandwidth of the respective power electronics 110, 112, 114, and 116 to create and analyze test waveforms. Without the energy storage devices 602, 604, 606, or 608, the bandwidth of the test waveform frequencies may be practically limited to frequencies less than the switching frequency of the power electronics 110, 112, 114, and 116. With the energy storage devices 602, 604, 606, or 608, the bandwidth of the test waveform frequencies may extend to frequencies greater than the switching frequency of the power electronics 110, 112, 114, and 116.

While illustrated as on the output of their respective power electronics 110, 112, 114, and 116 in FIG. 6, the energy storage devices 602, 604, 606, and 608 may be on any other portions of their respective power electronics 110, 112, 114, and 116 to store ripple energy and discharge the ripple energy out of phase. In an alternative embodiment, the energy storage devices 602, 604, 606, and 608 may be on the input of their respective power electronics 110, 112, 114, and 116 to store ripple energy and discharge the ripple energy out of phase. In another alternative embodiment, an additional winding may be added to the transformers of the energy storage devices 602, 604, 606, and 608 and the energy storage devices 602, 604, 606, and 608 may be connected to the this additional winding to store ripple energy and discharge the ripple energy out of phase.

EIS helps in understanding electrochemical processes by analyzing reflected electric signals that result when small, variable frequency electric signals are sent as test signals towards a battery or circuit under test. A battery's performance and health may be tested and characterized by analyzing the responses of batteries against different types of input waveforms (electric signals) using EIS.

U.S. Pat. No. 9,461,319, incorporated herein by reference in its entirety, teaches a method of performing EIS on fuel cells. A microcontroller, as shown part of EIS system, may perform EIS tests with the help of a tester circuit. A microprocessor may apply and control the type of waveform and time of application, frequency of the signal and other associated parameters. A battery may act as load to the input signals (small voltage signals). The output or response of the battery may be measured and stored. This data may be indicative of the state of the battery. For example, a 110 Hz sinusoidal signal may return as a chopped 105 Hz signal. The changes to the input signal may be a manifestation of changes happening inside the battery. The internal changes in the battery could be due to change in diffusion rate of ions at the electrode of the battery or due to wear and tear around the anode contact to the battery cells.

Embodiments of the present disclosure are directed to electrochemical impedance spectroscopy readings in order to increase battery performance and determine optimal charging times. EIS data, collected over a period of time for large number of batteries and different battery types, may help to perform in-situ analysis of the battery and suggest optimal time for charging the battery, which should lead to increase in performance and battery efficiency. EISA may be used in order to increase battery efficiency and performance which should increase the battery life.

An EIS process may be initiated by a charger control module by determining the type of battery a device is using, requesting the appropriate battery data from an EISA network learned database, and storing the battery data in a charger database. The charger control module may send a request to an EIS system control module to test the battery by receiving test wave form data from an EISA network charging module. In response to the test indicating that the battery needs charging, the charger control module may receive charging parameters from the EIS system control module.

The EIS system control module may receive command and parameter data from the EISA network learned database, which may be stored in EIS system commands and data databases, respectively. The EIS system control module may continuously poll for the charger control module to send a request to test the battery. The EIS system control module may use the data from the EIS system commands and data databases to perform the various tests and the results may be stored in the data database. The EIS system control module may use a charging algorithm in order to determine if the battery should or should not be charged using the data available in the EIS system data database, and the results from the charging algorithm may be sent to the charger control module.

The EISA network charging module may communicate with EIS systems to send command and parameter data, and with the charger control module to send the EISA learned database data. The EISA network charging module may also receive the data of the testing results from the testing the EIS system control module may perform on the battery, and this data may be stored in the EISA network learned database. An EISA network may receive and send this data to various EIS systems so that the EISA network learned database may continue to provide more and more relevant data back to the EIS systems and to the chargers.

Figure 7:
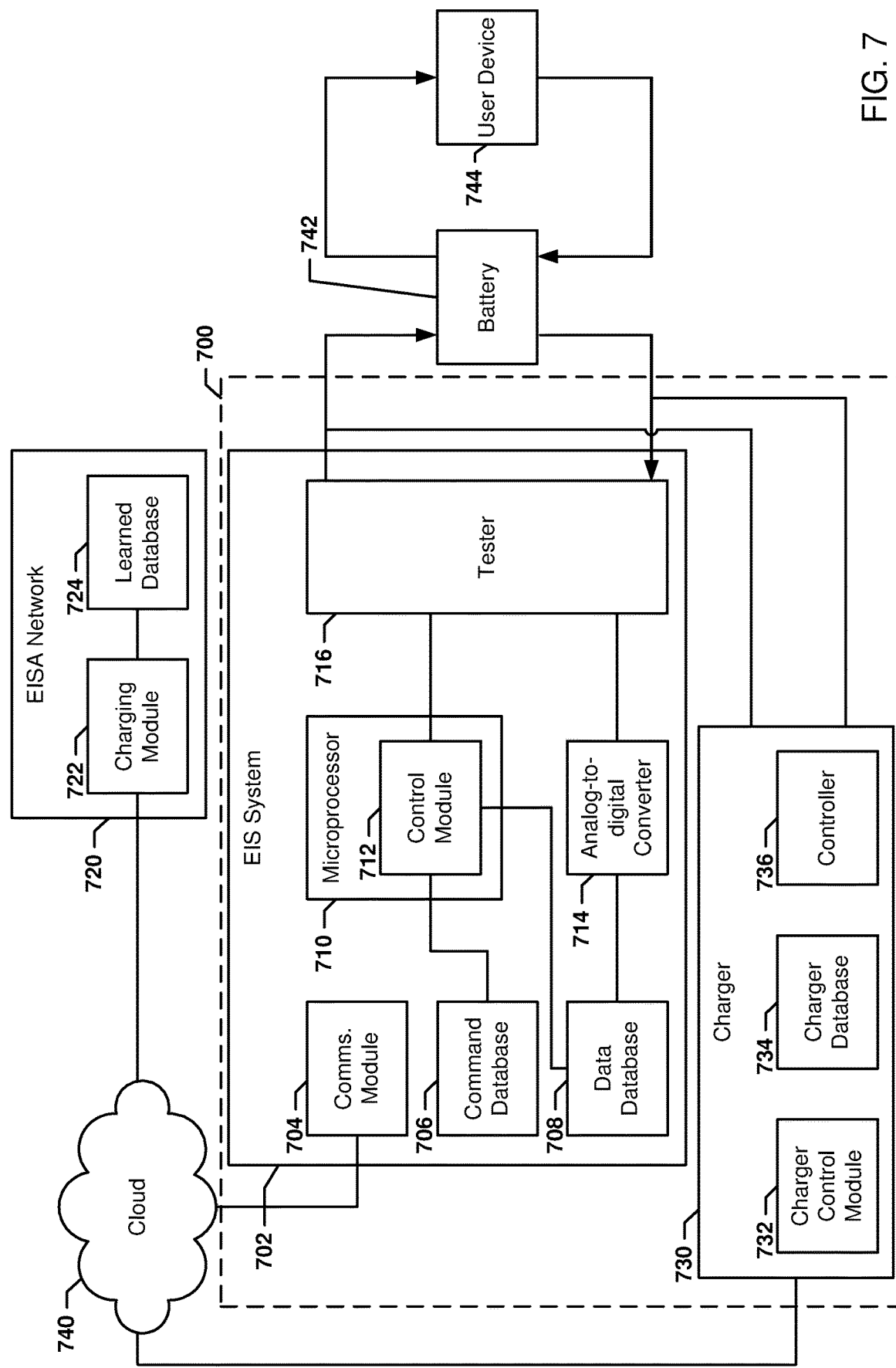
FIG. 7 is a block diagram of an EIS system connected to a device battery, a charger for a battery, and an Electrochemical Impedance Spectroscopy Analyzer (EISA) network according to an embodiment.

FIG. 7 illustrates an example of a system 700 according to an embodiment which includes an example EIS system 702 described in U.S. Pat. No. 9,461,319, incorporated herein by reference in its entirety. The system 700 may include a charger 730 for a battery 742. The charger 730 may include a controller 736 and may be connected to the battery 742. The battery 742 may or may not be connected to a user device 744 (such as laptop, mobile phone etc.). The device battery 742, as shown in FIG. 7, may be connected to an EIS system 702. The integrated EIS system 702 may allow running of an EIS test at the convenience of the charger 730. The EIS system 702 may include a communication module 704, represented as "Comms. Module" in FIG. 7, which may allow the EIS system 702 to communicate with an EISA network 720 via the Internet 740, such as in a cloud deployment. The communication module 704 may support both wired and wireless communication capabilities such as Ethernet, WIFI, Bluetooth, etc.

The EISA network 720 may include a database, referred to herein as the learned database 724, which may store data with respect to different type of batteries, problems associated with the batteries, respective input waveforms for testing the batteries, interchangeably referred to herein as EIS test waveforms, and EIS responses of the batteries, also referred to herein as response waveforms. The EISA network 720 may also include a charging module 722, which may communicate with the EIS system 702, look up data in the learned database 724, and send information back to the EIS system 702 via the communication module 704 to inform/instruct a microprocessor 710 of the EIS system 702 for conducting specified EIS tests on the attached battery 742. The EISA network 720 may also send information to charger 730, such as in a cloud connection via the Internet 740, to instruct the charger 730 when to turn ON/OFF and other charging parameters (such as current/voltage and charging time).

The charger 730 may include a charger control module 732 and a charger database 734 for supporting the storage of received data from the EISA network 720 and implementing the charging in accordance to stored data.

Figure 8:
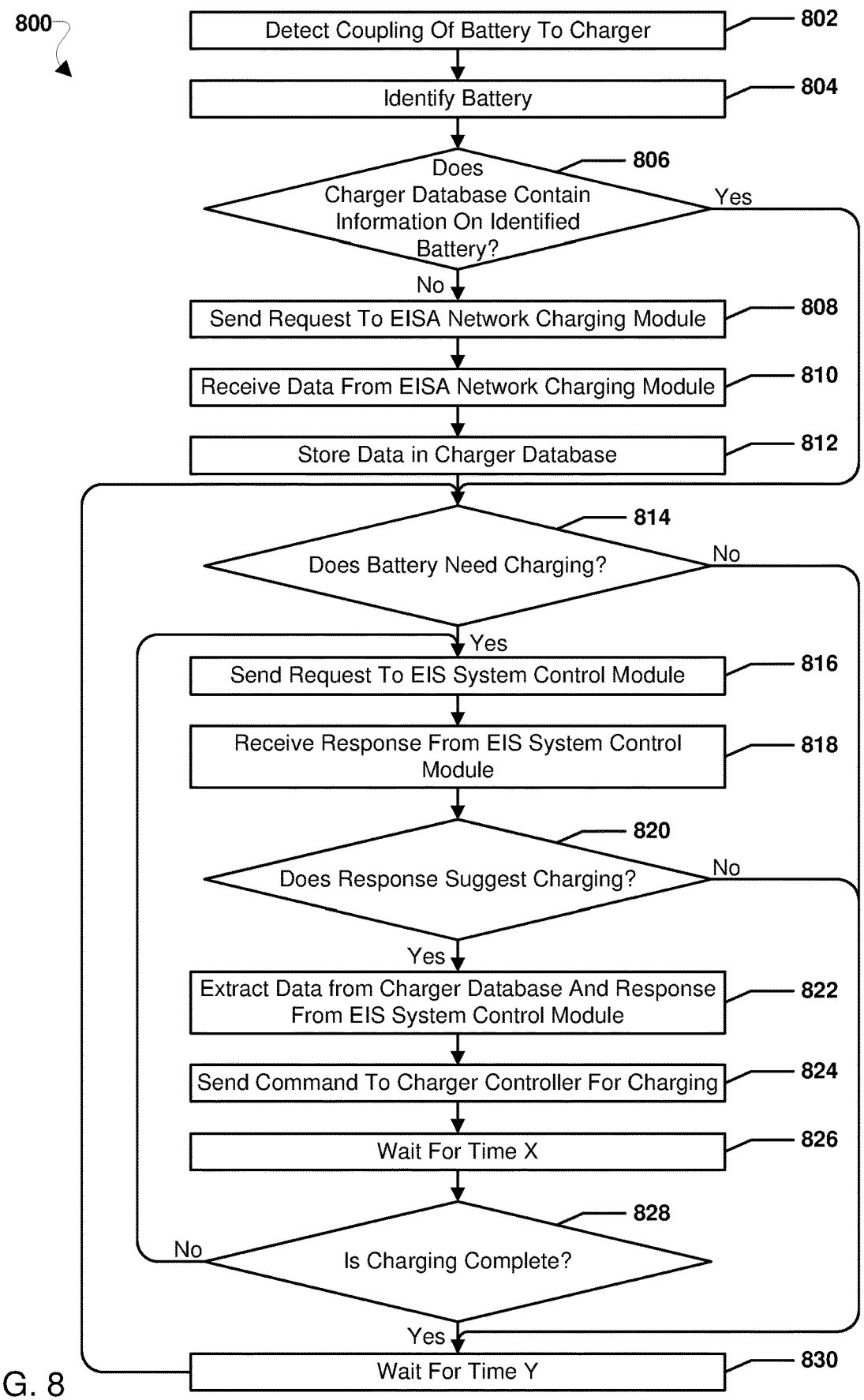
FIG. 8 is a process flow diagram illustrating a method for managing charging of a battery using EIS testing results according to an embodiment.

FIG. 8 illustrates a method 800 for managing charging of a battery using EIS testing results according to an embodiment. A charger control module (e.g., charger control module 732 in FIG. 7) may be configured to implement the method 800. The charger control module may be able to recognize a battery (e.g., battery 742 in FIG. 7) when the battery is coupled to a charger (e.g., charger 730 in FIG. 7) or the charger control module may receive input from a user regarding the type of the battery. The charger control module may send an identifier of the recognized battery to a charging module (e.g., charging module 722 in FIG. 7) in an EISA network (e.g., EISA network 720 in FIG. &) and initiate downloading of the appropriate portion of a learned database (e.g., learned database 724 in FIG. 7) specific to the battery from the EISA network via the Internet. The received learned database data may be stored in a charger database (e.g., charger database 734 in FIG. 7). The charger control module may poll the battery to check if the battery needs charging. If the battery needs a charge, the charger control module may send a request to an EIS system (e.g., EIS system 702 in FIG. 7) and instruct/inform a microprocessor (e.g., microprocessor 710 in FIG. 7) to test the battery, prior to initiating the charging. In order to conduct the tests, waveforms/waveform parameters may be downloaded an EIS system data database (e.g., data database 708 in FIG. 7) from an EISA network charging module (e.g., charging module 722 in FIG. 7). The EIS system may report back to the charger control module the results of the EIS test. The responses could be "Don't Charge, Too Early to Charge," or "Time to Charge, Do a small ramp charge," or could allow charging with specific parameters (time, current, etc.). After the battery is charged or in between several times through, the charger control module may go back to the EIS system to run another test to confirm that charging is going in correct direction.

The method 800 may be implemented in software executing in a software-configurable processor (such as a central processing unit, graphics processing unit, etc.), in general purpose hardware, in dedicated hardware, or in a combination of a software-configured processor and dedicated hardware, such as a processor executing software within a system for EIS testing (e.g., system 700, charger 730 in FIG. 7), and various memory/cache controllers. In order to encompass the alternative configurations enabled in various embodiments, the hardware implementing the method 800 is referred to herein as a "control device."

In block 802, the control device may detect coupling of the battery to the charger. Coupling of the battery may be detected by a change in voltage between positive and negative battery connections of the charger. In some embodiments, the control device may sense a voltage that may be compared to a previous voltage to determine a change in voltage, or sense a change in voltage. In some embodiments, the control device may receive signals from a sensor indicating a voltage that may be compared to a previously signaled voltage to determine a change in voltage, or indicating a change in voltage.

In block 804, the control device may identify the coupled battery. In some embodiments, the voltage or change in voltage may inform the control device of the type of battery coupled to the charger, as specific voltages or changes in voltage may be associated with specific battery types. In some embodiments, the battery coupling may communicate information regarding the battery to the control device. In some embodiments, the control device may receive information identifying the battery from a user of the charger, referred to herein as battery identifying information. Battery identifying information may include parameters, such as a battery identifier, a size, a power capacity, a chemical composition, a brand, a user device to which the battery is coupled, etc., that may be used to identify the battery.

In determination block 806, the control device may determine whether the charger database contains information on the identified battery. The control device may search the charger database for the battery identifying information and any information associated with the battery identifying information. The control device may use any combination of the battery identifying information to retrieve the information associated with the battery identifying information in the charger database. The information in the charger database associated with the battery identifying information may include parameters for whether and/or how to charge the battery in response to results of an EIS test. The information in the charger database associated with the battery identifying information may be referred to herein as battery charging information.

In response to determining that the charger database does not contain information on the identified battery (i.e., determination block 806="No"), the control device may send a request to the EISA network charging module to download the information on the battery in block 808. The control device may send any combination of the battery identifying information, charger identifying information, and/or a request for download of the information on the battery to trigger transmission of the information on the battery from the EISA network charging module. The information on the battery may include any combination and/or association of battery identifying information, battery charging information for the identified battery, and/or EIS testing information for the identified battery. EIS testing information may include EIS testing parameters, such as parameters that may define an EIS test waveform to apply to the battery, time to apply the waveform and/or measure an output response from the battery, also referred to herein in as EIS testing commands, and/or a response waveform range.

In block 810, the control device may receive data, including the information on the battery, from the EISA network charging module. A method 900 for transmission of the information on the battery from the EISA network charging module is described with reference to FIG. 9.

In block 812, the control device may store the information on the battery. The control device may store the information on the battery in charger database, which may be stored on a persistent or volatile memory of the charger. The control device may store the information in a manner that associates any combination of the battery identifying information with the battery charging information.

Following storing the information on the battery in block 812; or in response to determining that the charger database does contain information on the identified battery (i.e., determination block 806="Yes"), the control device may determine whether the battery needs charging in determination block 814. The control device may poll the battery to determine whether the battery needs charging. In some embodiments, the control device may use a voltage across the battery, determined in a similar manner as described with reference to detecting coupling of the battery to the charger in block 802, to determine whether the battery needs charging. The control device may compare the voltage across the battery with the battery charging information retrieved from the charger database to determine whether the voltage is an indicator for whether to charge the battery. For example, the battery charging information may have a charging threshold, and, depending on how the voltage compares to the charging threshold, the control device may determine whether the battery needs charging. The battery charging information may indicate by what charging parameters, such as time, current, voltage, etc., to charge the battery. In some embodiments, the battery charging information may include multiple charging thresholds, and, depending on how the voltage compares to any combination of the charging thresholds, the battery charging information may indicate whether and by what charging parameters, such as time, current, voltage, etc., to charge the battery.

In response to determining that the battery needs charging (i.e., determination block 814="Yes"), the control device may send an EIS test request to the EIS system control module (e.g., control module 712 in FIG. 7) in block 816. The EIS test request may instruct the EIS system control module to test the coupled battery. In some embodiments, the EIS test request may include any combination of battery identifying information for the battery.

In block 818, the control device may receive a response from the EIS system control module. The response may include an analysis of the results of an EIS test on the battery, which is referred to herein as a charging recommendation. A method 1000 for EIS testing is described with reference to FIG. 10, and a method 1100 for analysis of the EIS test results is described with reference to FIG. 11.

In determination block 820, the control device may determine whether the received response suggests charging the battery. The charging recommendation resulting from an analysis of the results of an EIS test may indicate and/or be interpreted to indicate whether to charge the couple battery. For example, the charging recommendation may indicate to charge or not to charge the battery as a result of the analysis. The charging recommendation may indicate any combination of types of charging, such as charging, fast charging, slow charging, etc. The charging recommendation may indicate to charge the battery according to specific charging parameters, such as time, current, voltage, etc., as a result of the analysis.

In response to determining that the received response suggests charging the battery (i.e., determination block 820="Yes"), the control device may extract data for charging the battery from the received response and the charger database in block 822. The control device may extract data, such as a charging recommendation, from the received response. A charging recommendation may indicate whether to charge the battery. In some embodiments, a charging recommendation may indicate how to charge the battery, including any combination of types of charging and/or charging parameters. In some embodiments, the charging recommendation may indicate the charging parameters directly and/or prompt retrieval of the charging parameters from the charger database.

In block 824, the control device may send a command to a charger controller (e.g., controller 736 in FIG. 7) for charging the coupled battery. The command for charging the coupled battery may include charging parameters extracted from the received response from the EIS system control module and/or the charger database. In response to the command, the charger controller may cause the charger to charge the coupled battery. In some embodiments, the charger controller may cause the charger to charge the coupled battery according to the charging parameters of the command. During and/or after the charger charges the coupled battery, the control device may wait for a time "X" in block 826. The time "X" may be a predetermined amount of time that is applied for all batteries, a predetermined amount of time specific to the type of couple battery, or a predetermined or calculated time of time based on the type of charging and/or charging parameters applied for all batteries or specific to the type of coupled battery.

In determination block 828, the control device may determine whether charging of the coupled battery is complete. The control device may poll the battery to determine whether the battery needs charging. In some embodiments, the control device may determine whether charging of the coupled battery is complete in a similar manner as determining whether the battery needs charging in determination block 814.

In response to determining that charging of the coupled battery is not complete (i.e., determination block 828="No"), the control device may send an EIS test request to the EIS system control module in block 816. By repeating the EIS testing in response to determining whether charging of the coupled battery is complete, the charging of the coupled battery may be adjusted in response to changes to the condition of the battery, such as charge level, in response to the previous charging of the battery.

In response to determining that charging of the coupled battery is complete (i.e., determination block 828="Yes"); or in response to determining that the battery does not need charging (i.e., determination block 814="No"), the control device may wait for a time "Y" in block 830. The time "Y" may be a predetermined amount of time that is applied for all batteries, a predetermined amount of time specific to the type of couple battery, or a predetermined or calculated time of time based on the type of charging and/or charging parameters applied for all batteries or specific to the type of coupled battery. Following expiration of the time "Y", the control device may determine whether the battery needs charging in determination block 814.

Figure 9:
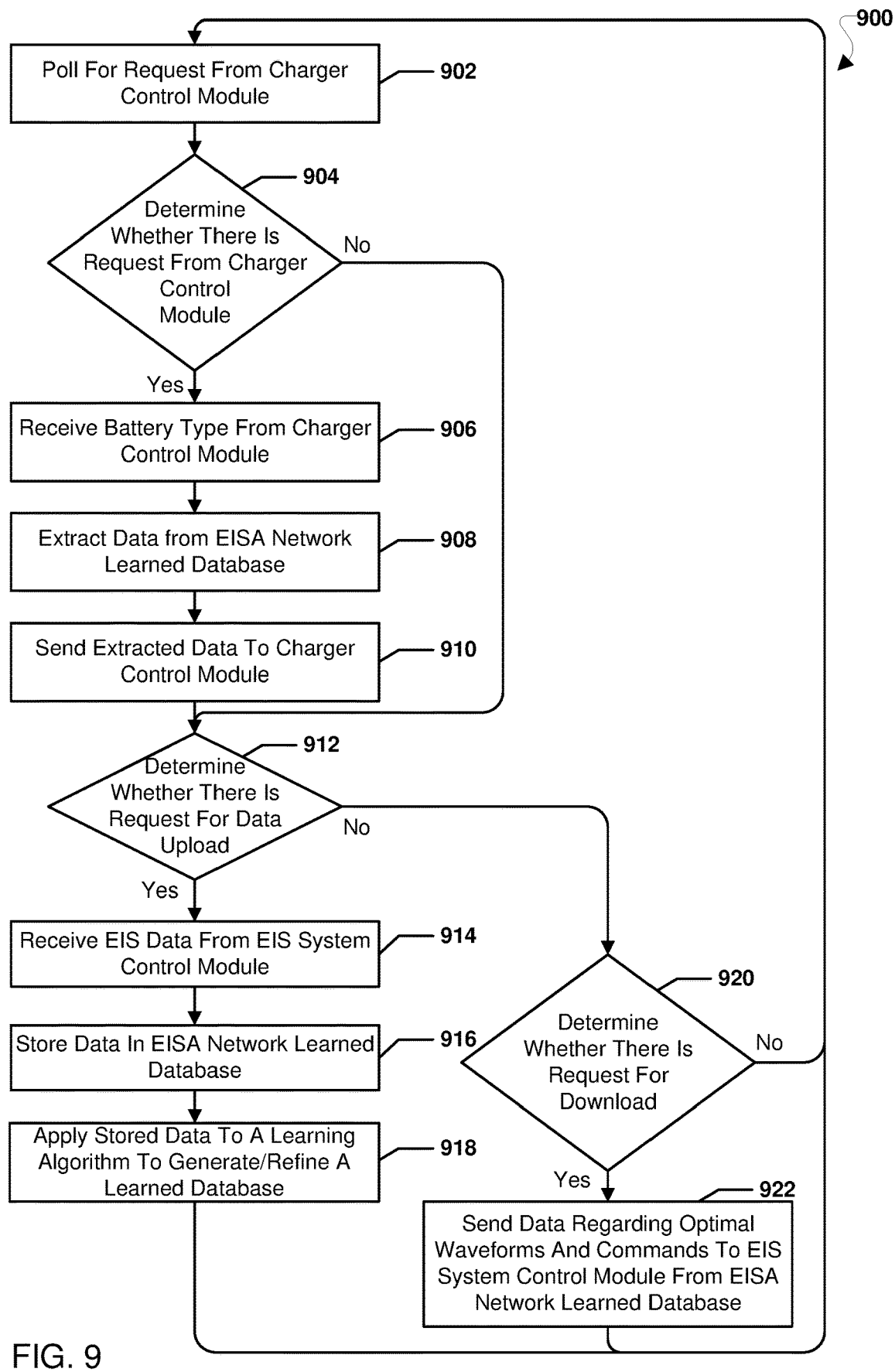
FIG. 9 is a process flow diagram illustrating a method for managing sharing of EIS battery testing data according to an embodiment.

FIG. 9 illustrates a method 900 for managing sharing of EIS battery testing data according to an embodiment. An EISA network charging module (e.g., charging module 722 in FIG. 7) and a server within an EISA network may be configured to implement the method 900. The EISA network charging module may poll for requests from a charger control module (e.g., charger control module 732 in FIG. 7). In response to a request received from the charger control module, the EISA network charging module may receive data indicative of type of battery (e.g., battery 742 in FIG. 7). The EISA network charging module may access an EISA network learned database (e.g., learned database 724 in FIG. 7) to extract relevant data specific to the type of battery. In response to the EISA network learned database having relevant data, relevant portion of the EISA network learned database may be sent to the charger control module for data to be loaded in a charger database (e.g., charger database 724 in FIG. 7). Optionally, the system may include sending information from the charger (e.g., charger 730 in FIG. 7) to the EISA network to be stored as a part of or enable generation of the EISA learned database. In response to a request received from an EIS system (e.g., EIS system 702 in FIG. 7), the EISA network charging module may determine whether the request is for uploading or for downloading. In response to the request being for uploading, EIS test data may be saved in EISA network learned database where the EIS test data may be analyzed along with other data collected for the same battery type but from different devices. The EIS test data may be analyzed to find the optimal test and associated parameters that may indicate optimal performance of the respective battery. In response to the request being for downloading, the optimal test values may be sent to an EIS system control module (e.g., control module 712 in FIG. 7) to be stored in an EIS system data database (e.g., data database 708 in FIG. 7) and an EIS system command database (e.g., command database 706 in FIG. 7), respectively.

The method 900 may be implemented in software executing in a software-configurable processor of a server of the EISA network (e.g., EISA network 720 in FIG. 7). In order to encompass the alternative configurations enabled in various embodiments, the hardware implementing the method 900 is referred to herein as a "EISA network server."

In block 902, the EISA network server may poll for a request from the charger control module. A request from the charger control module may include any combination of battery identifying information, charger identifying information, and/or a request for download of the information on the battery to trigger transmission of the information on the battery from the EISA network learned database. The EISA network learned database may be stored on a persistent or volatile memory of a server of the EISA network. The information on the battery may include any combination and/or association of battery identifying information, battery charging information for the identified battery, and/or EIS testing information for the identified battery. The EISA network server may check a communication interface, such as communication port of the server, for a request from a charger control module.

In determination block 904, the EISA network server may determine whether there is a request from the charger control module. As a result of polling for a request from the charger control module in block 902, the EISA network server may or may not identify a request from the charger control module. In response to identifying a request from the charger control module, the EISA network server may determine that there is a request from charger control module, and in response to not identifying a request from the charger control module, the EISA network server may determine that there is not a request from the charger control module. The EISA network server may check a communication interface, such as communication port of the EISA network server, for a request from a charger control module.

In response to determining that there is a request from the charger control module (i.e., determination block 904="Yes"), the EISA network server may receive a battery type from the charger control module in block 906. As discussed herein, in some embodiments, the charger control module may send a request with any combination of battery identifying information, which may include a battery type. In some embodiments, in response to the request from the charger control module, the EISA network server may request and receive any combination of battery identifying information, which may include a battery type. For example, the request may initiate a communication session between the EISA network server and the charger control module, and following setup of the communication session, the EISA network server may request and receive battery identifying information.

In block 908, the EISA network server may extract data from the EISA network learned database. The EISA network server may use the received battery identifying information such as the battery type, to locate and retrieve the information on the battery associated in the EISA network learned database with the received battery identifying information. The information on the battery may include any combination and/or association of battery identifying information, battery charging information for the identified battery, and/or EIS testing information for the identified battery. In block 910, the EISA network server may send the extracted data, also referred to herein in as the extracted information on the battery, to the charger control module.

Following sending the extracted information on the battery to the charger control module in block 910; or in response to determining that there is not a request from the charger control module (i.e., determination block 904="No"), the EISA network server may determine whether there is a request for upload in determination block 912. The EISA network server may check a communication interface, such as communication port of the EISA network, for a request for upload from an EIS system control module.

In response to determining that there is a request for upload (i.e., determination block 912="Yes"), the EISA network server may receive EIS testing result data from the EIS system control module in block 914. The EIS testing result data may include a recorded response waveform generated in response to injection of an EIS test waveform and converted into a digital format. In some embodiments, EIS testing result data may also include any combination of battery identifying information, charger identifying information, EIS testing information, and/or a charging recommendation associated with the EIS tests conducted that produced the response waveforms. In some embodiments, the EIS testing result data may also include performance parameters of the battery, such as a current, voltage, capacity, charge level, and/or discharge rate of the battery. In some embodiments a performance parameter of the battery may include a current and/or a voltage used to charge the battery prior to the EIS test.

In block 916, the EISA network server may store the uploaded EIS testing result data to the EISA network learned database. The EISA network server may store the EIS testing result data to the EISA network learned database in a manner that associates the EIS testing result data to the information on the battery already stored in the EISA network learned database for the appropriate battery. The EISA network server may store the EIS testing result data to the EISA network learned database in a manner that associates the EIS testing result data to the information on the battery by creating a new entry in the EISA network learned database for the appropriate battery, such as for a battery not already having an entry in the EISA network learned database.

In some embodiments, in block 918, the EISA network server may analyze the stored EIS testing result data along with other data collected for the same battery type tested by different EIS systems and/or connected to different user devices (e.g., user device 744 in FIG. 7) to generate and/or update or enhance the learned database. In some embodiments, the EISA network server may apply stored data to a learning algorithm (e.g., an AI or neural network model) to generate and/or update or enhance the learned database. Such analysis of the EIS testing result data may result in optimal EIS tests and associated parameters that may be applied to batteries to determine the performance and/or charge state of the battery.

In response to determining that there is not a request for upload (i.e., determination block 912="No"), the EISA network server may determine whether there is a request for download in determination block 920. A request for download from the EIS system, including the EIS system control module, may include any combination of battery identifying information, charger identifying information, and/or a request for download of EIS testing information for the battery to trigger transmission of the EIS testing information from the EISA network learned database. The EISA network server may check a communication interface, such as communication port of the EISA network, for a request for download from the EIS system control module.

In response to determining that there is a request for download (i.e., determination block 920="Yes"), the EISA network server may send any combination of EIS testing information to the EIS system control module in block 922. The EIS testing information may include any combination of parameters of an EIS test waveform, EIS testing commands, and/or a response waveform range. The EIS testing information may be retrieved from the EISA network learned database for the battery coupled to the EIS system. In some embodiments, the EIS testing information may include optimal EIS testing information as determined by the analysis of the EIS testing result data stored to the EISA network learned database.

Following storing the uploaded EIS testing result data to the EISA network learned database in block 916; in response to determining that there is no request for download (i.e., determination block 918="No"); or following sending any combination of EIS testing information to the EIS system control module in block 920, the EISA network server may poll for a request from the charger control module in block 902.

Figure 10:
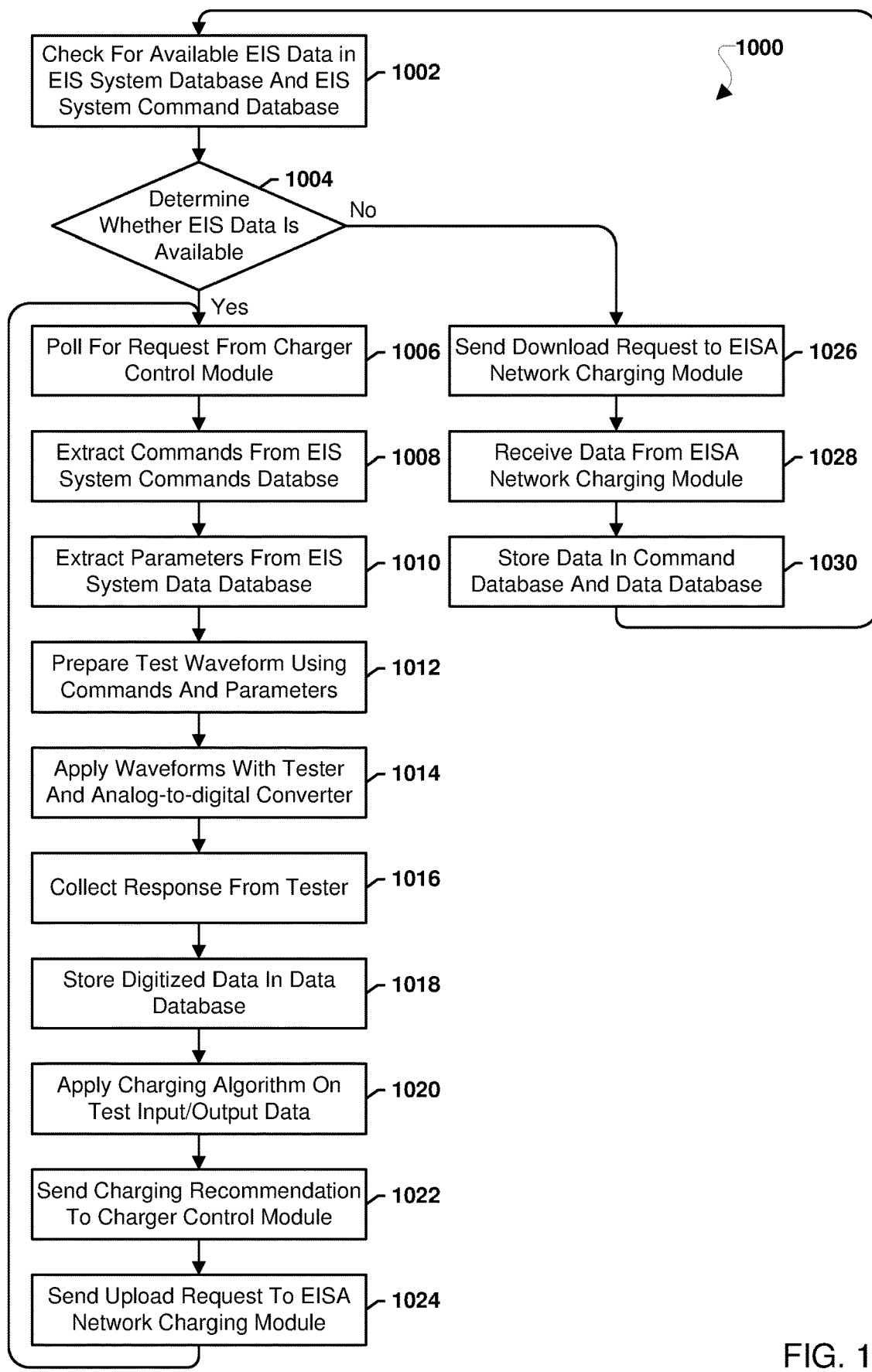
FIG. 10 is a process flow diagram illustrating a method for EIS testing and charging of a battery according to an embodiment.

FIG. 10 illustrates a method 1000 for EIS testing and charging of a battery according to an embodiment. An EIS system control module (e.g., control module 712) may be configured to determine if EIS data is available in an EIS system command database (e.g., command database 706 in FIG. 7) and EIS system data database (e.g., data database 708 in FIG. 7). In response to the data being not available, the EIS system control module may send a request to an EISA network charging module (e.g., charging module 722 in FIG. 7) for the EIS data, also referred to herein in as EIS testing information, receive the EIS data, and store the EIS data in the EIS system command database and the EIS system data database. The EIS system command database may contain commands, such as "Measure for 5 seconds," whereas the EIS system data database may contain parameters describing a signal, such as an EIS test waveform, such as frequency being 110 Hz and current 3 mA. In response to the EIS system command database and EIS system data database being loaded with the EIS data from the EISA network (e.g., EISA network 720 in FIG. 7), the EIS system control module may continuously poll for a response from a charger (e.g., charger 730 in FIG. 7). A charger control module (e.g., charger control module 732 in FIG. 7) may instruct the EIS system control module to run EIS tests. The EIS system control module may initiate the set of commands with respect to the data in EIS system command database and the EIS system data database, and by running the information through digital-to-analog converter (e.g., digital-to-analog converter 714 in FIG. 7) to generate a waveform for a tester (e.g., tester 716 in FIG. 7). The tester may create a final waveform that goes into the battery (e.g., battery 742 in FIG. 7). The tester may receive the response and put it through the digital-to-analog converter. The digitized data may be stored in the EIS system data database. Thus, the EIS system data database may store two types of information: test waveform data received from an EISA network learned database (e.g., learned database 724 in FIG. 7) via the EISA network charging module and the response of the battery received by the tester followed by the digital-to-analog converter. The EIS system control module may be configured with an algorithm ("charging algorithm") that determines parameters to be passed back to the charger control module essentially instructing/indicating to the charger whether to charge, not to charge, or charge with specific parameters. The test data may also be uploaded to the EISA network learned database by sending an upload data request to the EISA network charging module after conducting the tests.

The method 1000 may be implemented in software executing in a software-configurable processor (such as a central processing unit, graphics processing unit, etc.), in general purpose hardware, in dedicated hardware, or in a combination of a software-configured processor and dedicated hardware, such as a processor executing software within a system for EIS testing (e.g., system 700, EIS system 702 in FIG. 7), and various memory/cache controllers. In order to encompass the alternative configurations enabled in various embodiments, the hardware implementing the method 1000 is referred to herein as a "control device."

In block 1002, the control device may check for available EIS testing information in an EIS system data database and an EIS system command database. The control device may use battery identify information, which the control device may receive from a charger, to check for available EIS testing information in the EIS system data database and the EIS system command database. EIS testing information in the EIS system data database and the EIS system command database may be stored in association with battery identify information. The EIS system data database and the EIS system command database may be stored on any combination of persistent and/or volatile memories of the EIS system.

In determination block 1004, the control device may determine whether EIS testing information is available. The control device may attempt to check for existence of entries of EIS testing information associated with the battery identifying information from the EIS system data database and the EIS system command database. Existence of entries having available EIS testing information in the EIS system data database and the EIS system command database may be indicated in response to the check. An indication of no available information, such as a null value, an error, or a message, may be returned in response to no EIS testing information being available in the EIS system data database and the EIS system command database.

In response to determining that EIS testing information is available (i.e., determination block 1004="Yes"), the control device may poll for a request from a charger control module in block 1006. The request from the charger control module may be an EIS test request that may instruct the control device to test the coupled battery. In some embodiments, the EIS test request may include any combination of battery identifying information for the battery. The control device may check a communication interface, such as communication port or communication module (e.g., comms. module 704 in FIG. 7) of the EISA system, for a request from the charger control module.

In block 1008, the control device may extract EIS testing commands from the EIS system command database. The control device may retrieve entries of EIS testing commands associated with the battery identifying information from the EIS system command database. Available EIS testing commands may be returned from the EIS system command database.

In block 1010, the control device may extract parameters from the EIS system data database. The control device may retrieve entries of parameters, such as parameters that may define an EIS test waveform, associated with the battery identifying information from the EIS system data database. Available parameters may be returned from the EIS system data database.

In block 1012, the control device may prepare an EIS test waveform using EIS testing commands and parameters. The control device may use the parameters to generate the EIS test waveform and use the EIS testing commands to determine how long to generate the EIS test waveform. The control device may load the parameters and the EIS testing commands and use the parameters and the EIS testing commands to signal an analog-to-digital converter with digital signals of instructions for generating the EIS test waveform.

In block 1014, the control device may apply the EIS test waveform to the battery. The control device may send the digital signals of instructions for generating the EIS test waveform to the analog-to-digital converter so that the analog-to-digital converter may convert the digital signals to analog signals. The analog signals may be provided by the analog-to-digital converter to a tester, which may respond to the analog signals by generating an EIS test waveform according to the instructions of the analog signals. The tester may apply the generated EIS test waveform to the battery coupled to the EIS system. The tester may apply the generated EIS test waveform to the battery for a period as indicated by the analog signals and may cease generating the EIS test waveform upon expiration of the period.

In block 1016, the control device may collect a response waveform. The tester may receive a response waveform from the battery generated in response to the EIS test waveform. The tester may provide the response waveform to the analog-to-digital converter, which may convert the analog response waveform to a digital response waveform. The control device may receive the digital response waveform.

In block 1018, the control device may store the digital response waveform to the EIS system data database. In some embodiments, the control device may format the digital response waveform as a digital data file, such as a ".dat" format file. The control device may store the digital response waveform to the EIS system data database in a manner such that the digital response waveform may be associated with battery identifying information in the EIS system data database for the tested battery.

In block 1020, the control device may apply a charging algorithm on the input and output of the EIS test. The charging algorithm may generate a charging recommendation. The charging algorithm is described further herein with reference to the method 1100 in FIG. 11.

In block 1022, the control device may send the charging recommendation to the charger control module. In block 1024, the processing device may send an upload request to the EISA network charging module. The upload request may include the digital response waveform. The control device may continually and/or repeatedly poll for a request from a charger control module in block 1006.

In response to determining that EIS testing information is not available (i.e., determination block 1004="No"), the control device may send a download request to the EISA network charging module in block 1026. A request from the control device may include any combination of battery identifying information, charger identifying information, and/or a request for download of the information on the battery to trigger transmission of the information on the battery from an EISA network learned database by the EISA network charging module. In block 1028, the control device may receive information on the battery from the EISA network charging module.

In block 1030, the control device may store the received information on the battery to the EIS system command database and to the EIS systems database. The control device may extract EIS testing commands from the received information on the battery. The control device may store the EIS testing commands in the EIS system command database in a manner that associates the EIS testing commands with battery identifying information for the battery coupled to the EIS system. The control device may extract parameters, such as parameters that may define an EIS test waveform, from the received information on the battery. The control device may store the parameters in the EIS system data database in a manner that associates the parameters with battery identifying information for the battery coupled to the EIS system. The control device may again check for available EIS testing information in the EIS system data database and the EIS system command database in block 1002.

Figure 11:
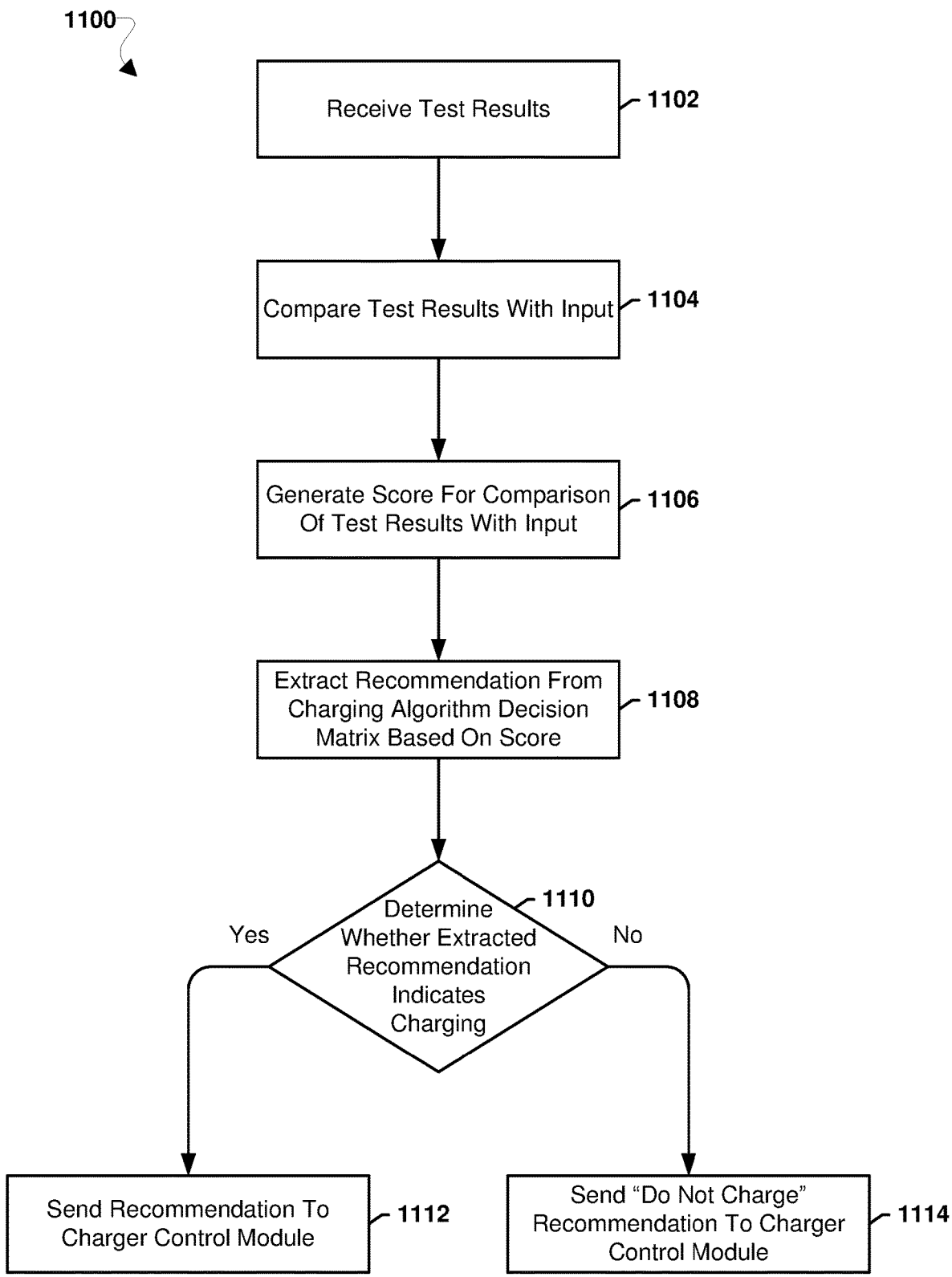
FIG. 11 is a process flow diagram illustrating a method for making a battery charging recommendation using EIS testing results according to an embodiment.

FIG. 11 illustrates a method 1100 for making a battery charging recommendation using EIS testing results according to an embodiment. A charging algorithm module may be implemented as part of microprocessor (e.g., microprocessor 710 in FIG. 7) or a specific module outside the microprocessor. The charging algorithm module may take into account, input and output data from an EIS system data database (e.g., EIS system data database 708 in FIG. 7) and check if a response waveform is within certain defined ranges for charging. A comparison of the input and a reflected waveform can be represented as a number or score as a percentage of difference between the input and reflected waveforms to the input waveform. Based on the score, the charging algorithm module may send instructions to a charger control module (e.g., charger control module 732) via an EIS system control module (e.g., control module 712 in FIG. 7) on whether to charge or not. In response to the charging algorithm module determining to instruct "charging", the charging algorithm module may also decide whether special parameters may need to be sent to the charger control module. A recommendation may be taken with help of a decision matrix, as described further herein with reference to FIG. 12, containing defined ranges for the scores and defined actions.

The recommendation could also be an outcome of an aggregate decision based on a plurality of tests according to a plurality of waveforms. The recommendation might be taken based on a majority of outcomes. For example, in response to three out of four tests may indicate "do not charge" or "no need" or "charging" as the recommendation, the EIS system control module may suggest a charger (e.g., charger 730 in FIG. 7) to not charge.

A test waveform may be a full frequency sweep waveform. In another embodiment, the test waveform may be super positioned frequencies or standard ranges of frequencies to enable only particular regions of frequencies to be tested, such as 10 KHZ, 8 KHZ, 6 KHZ, 4 KHZ, 3 KHZ, 2 KHZ, 1 KHZ, etc.

The method 1100 may be implemented in software executing in a software-configurable processor (such as a central processing unit, graphics processing unit, etc.), in general purpose hardware, in dedicated hardware, or in a combination of a software-configured processor and dedicated hardware, such as a processor executing software within a system for EIS testing (e.g., system 700, EIS system 702 in FIG. 7), and various memory/cache controllers. In order to encompass the alternative configurations enabled in various embodiments, the hardware implementing the method 1100 is referred to herein as a "control device."

In block 1102, the control device may receive EIS testing results. The EIS testing results may include a response waveform, such as a digital response waveform. The control device may receive the response waveform from an EIS system control module. In some embodiments, the EIS testing results may include the EIS testing inputs, which may include the parameters for defining an EIS test waveform.

In block 1104, the control device may compare the response waveform and the EIS test waveform applied to a battery (e.g., battery 742 in FIG. 7). The control device may compare the response waveform and the EIS test waveform to determine a difference between the waveforms. The difference could be in the form of frequency difference, amplitude difference, etc. In some embodiments, the control device may retrieve the response waveform and the EIS test waveform from an EIS system data database to implement the comparison.

In block 1106, the control device may generate a score for the comparison of the response waveform to the EIS test waveform. The comparison of an input, the EIS test waveform, and a reflected waveform, the response waveforms, may be represented as a number or score as a percentage of difference between the input and reflected waveform to the input waveform.

In block 1108, the control device may extract a charging recommendation from a charging algorithm decision matrix based on the score. The control device may check if the response waveform is within certain predefined or learned ranges for charging stored in the charging algorithm decision matrix, which may be loaded to the control device and/or stored to a persistent and/or volatile memory of the EIS system. The control device may compare the score to the ranges for the comparison results, which may include predefined or learned ranges for difference in amplitude, difference in frequency, etc. In response to the score being within a predefined or learned range, the control device may retrieve a charging recommendation associated with the range in the charging algorithm decision matrix. In some embodiments, the charging recommendation may be an outcome of an aggregate decision based on a plurality of EIS tests according to a plurality of EIS test waveforms and response waveforms. The recommendation may be based on a majority of outcomes. For example, three out of four tests may indicate some form of not charging, such as "do not charge," "no need to charge," or "already charging," as the recommendation. The majority recommendation may be not to charge to battery. In response, the control device may determine that the charging recommendation may be to not charge the battery.

In determination block 1110, the control device may determine whether the recommendation indicates charging. The charging recommendation may indicate charging, in any number of various forms, or not to charge. The control device may determine from the content of the charging recommendation whether the charging recommendation is to charge, in any of the various forms, or not to charge.

In response to determining that the recommendation indicates charging (i.e., determination block 1110="Yes"), the control device may send the charging recommendation to charge a charger control module in block 1112. The charging recommendation may indicate to the charger control module to charge the battery. In some embodiments, the charging recommendation may indicate to the charger control module to charge the battery according to specific parameters, such as any combination of charging speed and/or charge level.

In response to determining that the recommendation indicates not to charge (i.e., determination block 1110="No"), the control device may send the charging recommendation not to charge to the charger control module in block 1114.

FIG. 12 illustrates an example charging algorithm decision matrix 1200. The charging algorithm decision matrix 1200 may be stored to volatile and/or persistent memory of an EIS system (e.g., EIS system 702 in FIG. 7), and may be stored as part of a charging algorithm. The charging algorithm decision matrix 1200 may represent various patterns that the charging algorithm may use in order to determine a charging recommendations based on inputs, EIS test waveforms, and outputs, response waveforms, of an EIS tester (e.g., tester 716 in FIG. 7) that may be sent to a charging control module (e.g., charger control module 732 in FIG. 7) via an EIS system control module (e.g., control module 712 in FIG. 7). The recommendations may not indicate any charging or may indicate normal charging. However, an abnormal state may indicate special parameters or pattern for charging the batteries (e.g., battery 742 in FIG. 7).

Column 1 1202 may include an EIS test identifier. Column two 1204 may include EIS test waveforms that may be used for a specific battery type. For example, the EIS test waveforms may be different types of waveforms (e.g., sinusoidal wave, 100 Hz, and sinusoidal wave, 200 Hz) applied as input to the battery. Column three 1206 may include reflected/response waveforms (which may be stored as data files) may represent the response to the EIS test waveforms applied to the battery. The comparison of input and reflected waveform may be represented as a number or a score as a percentage of a difference between the input and reflected waveforms to the input waveform. The difference could be in the form of frequency difference, amplitude difference, etc. Based on the score, a recommendation regarding charging and charging parameters may be identified. In response to the difference being large, such as being in a large difference range, the recommendation could be to charge swiftly using a large current. Ranges of scores may be stored in column four 1208 and column five 1210 of the charging algorithm decision matrix 1200. Column six 1212 may store charging recommendations associated with the ranges in column four 1208 and/or column 5 1210. For example, in response to a sinusoid wave of 100 Hz sent as test waveform and a response waveform that is within 10% of amplitude change and within 5% of frequency change with respect to the input waveform, the charging recommendation may be no need for charging. Whereas, in response to an amplitude change beyond 10%, the charging recommendation may be that charging is considered necessary.

FIG. 13 illustrates an example EISA network learned database 724. The EISA network learned database 724 may be stored to volatile and/or persistent memory of an EISA network (e.g., EISA network 702 in FIG. 7). The EISA network learned database 724 may contain learning from historical data related to EIS tests conducted on various types of batteries (e.g., battery 742 in FIG. 7). The historical data may be collected primarily through the communication module (e.g., comms. module 704 in FIG. 7) present in an EIS System (e.g., EIS system 702 in FIG. 7), that may upload EIS test results related to the batteries with which the EIS system is connected, along with performance parameters. The EISA network learned database 724 may analyze the EIS test data and response data against the performance parameters and prescribe the tests and response range values for EIS tests that resulted in best performance.

Column one 1302 and column two 1304 may identify the battery type and battery identifier, as EIS tests may be applicable to a variety of battery technologies and models. Column three 1306 may store the EIS test waveform parameters found to be most suitable for testing the performance of respective batteries. Column four 1308 may store commands for the EIS System to apply the test parameters in column three 1306 and to collect a response from the EIS System. Column five 1310 may store a range for a response waveform with respect to an input waveform that is considered to be beneficial for optimal performance. Variation of an EIS test response outside the range may indicate a requirement of charging and a degree of the variation may reflect the charging parameters that should be employed while charging. Column six 1312 may store a charger type that is associated with the charging of the battery. Column seven 1314 and column eight 1316 may store optimal charging current and voltage that should be employed by a charger (e.g., charger 730 in FIG. 7) mentioned in the column six 1312 for charging the respective battery.

FIG. 14 illustrates a charger database 734 located on a volatile and/or persistent memory of a charger (e.g., charger 730 in FIG. 7). Column one 1402 may store different types of batteries (e.g., battery 742 in FIG. 7) supported by the charger. There may be smart universal chargers that may charge various kinds of batteries and devices (e.g., user device 744 in FIG. 7). For example, the same charger may be utilized for two different smart phone models. Column two 1404 may store recommendations that the charger may receive from an EIS system (e.g., EIS system 702 in FIG. 7). Column three 1406 and column four 1408 may store specific charging parameters, such as charging current and charging voltage that should be used when respective recommendations are received.

FIGS. 15A and 15B illustrate an example EIS system data database 708 and an example EIS system command database 706, which may contain portions of information stored in an EISA network learned database (e.g., EISA network learned database 724 in FIGS. 7 and 13) and may be sent to and EIS System (e.g., EIS system 702 in FIG. 7) via an EISA network charging module (e.g., EISA network charging module 722 in FIG. 7). The EIS system data database 708 and an EIS system command database 706 may be stored to volatile and/or persistent memory of the EIS system.

The EISA system data database 708 may contain waveform data related to EIS tests that may be performed on connected batteries (e.g., battery 742 in FIG. 7) to find optimal time and parameters for charging the battery. Column one 1502 and column two 1504 may store a battery type and a battery identifier. Column three 1506 may store parameters that may be downloaded by a communication module (e.g., comms. module 704 in FIG. 7) of the EIS system from the EISA network learned database via an EISA network charging module (e.g., EISA network charging module 722 in FIG. 7). Column four 1508 may store an output or response waveform in a digital data file format that may be generated by passing the output waveform obtained from an EIS tester (e.g., tester 716 in FIG. 7) through an analog-to-digital converter (e.g., analog-to-digital converter 714 in FIG. 7). Column five 1510 may store a recommendation taken by the EIS System based on a charging algorithm, which may be stored as a portion of code/software within a microprocessor (e.g., microprocessor 710) of the EIS System. The charging algorithm may base its recommendation on a variation between a response waveform and an EIS test waveform. A higher variation may be indicative of a non-optimal state and may require charging to move out of the unfavorable state. A charger (e.g., charger 730 in FIG. 7) may be guided to charge the battery so that the battery's response waveform may stay within a preferred zone (does not change much).

The EIS system command database may represent commands that may be sent to the tester for conducting an EIS test. Column one 1512 and column two 1514 may store a battery type and a battery identifier. Column three 1516 may store commands, such as when and for how long test signals may be applied, and when and how long output signals may be measured. There may be other form of commands possible that may be stored in this database.

Figure 16:
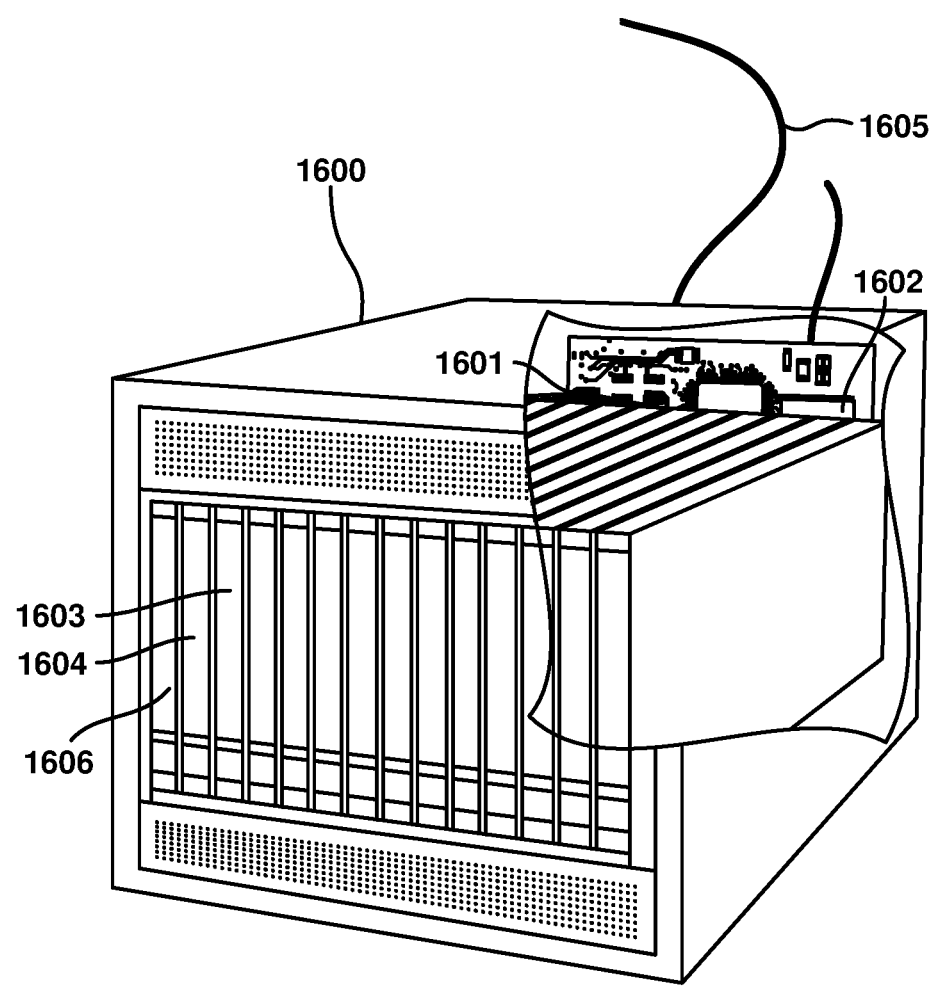
FIG. 16 is a component block diagram of server suitable for use with the various embodiments.

The EISA system data database 708 and the EISA network may be implemented on any of a variety of commercially available computing devices, such as a server 1600 as illustrated in FIG. 16. Such a server 1600 typically includes a processor 1601 coupled to volatile memory 1602 and a large capacity nonvolatile memory, such as a disk drive 1603. The server 1600 may also include a floppy disc drive, compact disc (CD) or DVD disc drive 1604 coupled to the processor 1601. The server 1600 may also include network access ports 1606 coupled to the processor 1601 for establishing data connections with a network 1605, such as a local area network coupled to other operator network computers and servers.

The processors may be any programmable microprocessor, microcomputer or multiple processor chip or chips that can be configured by software instructions (applications) to perform a variety of functions, including the functions of the various embodiments described in this application. In some wireless devices, multiple processors may be provided, such as one processor dedicated to wireless communication functions and one processor dedicated to running other applications. Typically, software applications may be stored in the internal memory 1603 before they are accessed and loaded into the processor. The processor may include internal memory sufficient to store the application software instructions.

The foregoing method descriptions and diagrams are provided merely as illustrative examples and are not intended to require or imply that the steps of the various embodiments must be performed in the order presented. As will be appreciated by one of skill in the art the order of steps in the foregoing embodiments may be performed in any order. Further, words such as "thereafter," "then," "next," etc. are not intended to limit the order of the steps; these words are simply used to guide the reader through the description of the methods.

One or more diagrams have been used to describe exemplary embodiments. The use of diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements may be implemented using computing devices (such as computer) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. An electrochemical impedance spectroscopy analyzer ("EISA") system, comprising:
    an EISA network, comprising:
        a charging module; and
        a learned database,
    wherein the charging module is configured to:
        receive an EIS test waveform for an EIS test on a battery, a response waveform for the EIS test, and performance parameters of the battery from an electrochemical impedance spectroscopy ("EIS") system communicatively connected to the EISA network; and
        store the EIS test waveform, the response waveform, and the performance parameters in the learned database as associated with the battery,
    wherein the learned database is configured to analyze the EIS test waveform, the response waveform, and the performance parameters with historical EIS test waveforms, historical response waveforms, and historical performance parameters associated with the battery to determine EIS testing information for the battery; and
    wherein the charging module is further configured to:
        receive battery identifying information for the battery from a charger communicatively connected to the EISA network;
        retrieve information on the battery from the learned database associated with the battery identifying information;
        send the information on the battery to the charger;
        determine whether there is a request to download information on the battery from the charger, wherein receiving battery identifying information for the battery from a charger, retrieving information on the battery from the learned database associated with the battery identifying information, and sending the information on the battery to the charger occur in response to determining that there is a download information on the battery from the charger; and
        determine whether there is a request to upload from the EIS system, wherein receiving an EIS test waveform for an EIS test on a battery, a response waveform for the EIS test, and performance parameters of the battery, storing the EIS test waveform, the response waveform, and the performance parameters in the learned database as associated with the battery, and analyzing the EIS test waveform, the response waveform, and the performance parameters with historical EIS test waveforms, historical response waveforms, and historical performance parameters associated with the battery occur in response to determining that there is a request to upload from the EIS system.

2. The EISA system of claim 1, wherein the charging module is further configured to:
    receive battery identifying information for the battery from the EIS system;
    retrieve the EIS testing information for the battery from the information on the battery stored on the learned database, wherein the EIS testing information includes parameters of an EIS test waveform for the battery and EIS testing commands for the battery; and
    send the EIS testing information for the battery to the EIS system.

3. The EISA system of claim 2, wherein the charging module is further configured to
    determine whether there is a request to download EIS testing information for the battery from the EIS system in response to determining that there is not a request to upload from the EIS system, wherein receiving battery identifying information for the battery, retrieving the EIS testing information for the battery from the information on the battery stored on the learned database, and sending the EIS testing information for the battery to the EIS system occur in response to determining that there is a request to download EIS testing information for the battery from the EIS system.

4. An electrochemical impedance spectroscopy analyzer ("EISA") system, comprising:
    an electrochemical impedance spectroscopy ("EIS") system electrically connectable to a battery; and
    a charger communicatively connected to the EIS system and electrically connectable to the battery, and comprising:
        a charger control module; and
        a charger database;
    wherein the charger control module is configured to:
        identify the battery;
        determine whether the charger database contains information on the battery;
        send a request for information on the battery to an EISA network communicatively connected to the charger in response to determining that the charger database does not contain information on the battery;
        receive the information on the battery from the EISA network;
        store the information on the battery in the charger database as associated with the battery;
        determine whether the battery needs charging; and
        send an EIS test request to the EIS system in response to determining that the battery needs charging.

5. The EISA system of claim 4, wherein the charger control module is further configured to:
    receive a response from the EIS system indicating whether charging the battery is recommended;
    determine whether the response indicates that charging the battery is recommended in a charging recommendation;
    extract data for charging the battery associated with the charging recommendation from the charger database in response to determining that the response indicates that charging the battery is recommended; and
    send a command to charge the battery to the control module, wherein the command includes the data extracted from the charger database for charging the battery.

6. The EISA system of claim 4, wherein the EIS system comprises:
    a control module;
    a data database; and
    a command database;
    wherein the control module is configured to:
        determine whether EIS testing information for the battery is available in the data database and the command database;

send a request to download EIS testing information for the battery to the EISA network communicatively connected to the EIS system;
receive EIS testing information for the battery from the EISA network, wherein the EIS testing information includes EIS test waveform parameters and EIS testing commands;
store the EIS test waveform parameters in the data database as associated with the battery; and
store the EIS testing commands in the command database as associated with the battery.

7. The EISA system of claim 4, wherein the EIS system comprises:
a control module configured to:
receive the EIS test request;
prepare an EIS test waveform according to EIS test waveform parameters associated with the battery;
apply the EIS test waveform to the battery according to EIS testing commands associated with the battery;
collect a response waveform from the battery according to the EIS testing commands;
convert the response waveform from analog signals to digital signals;
apply a charging algorithm to the EIS test waveform parameters and the digital signals of the response waveform to determine a charging recommendation; and
send the charging recommendation to the charger.

8. The EISA system of claim 7, wherein the EIS system further comprises:
a data database; and
a command database, and
wherein the control module is further configured to:
retrieve the EIS test waveform parameters associated with the battery from the data database;
retrieve the EIS testing commands associated with the battery from the command database;
store the digital signals of the response waveform in the data database as associated with the battery and the EIS test waveform parameters; and
send an upload request for the digital signals of the response waveform to the EISA network communicatively connected to the EIS system.

9. The EISA system of claim 7, wherein the EIS system further comprises a charging algorithm decision matrix, and wherein the control module is further configured such that applying a charging algorithm to the EIS test waveform parameters and the digital signals of the response waveform to determine a charging recommendation comprises:
comparing the EIS test waveform parameters and the digital signals of the response waveform;
generating a score for the comparison of the EIS test waveform parameters and the digital signals of the response waveform;
extracting the charging recommendation from the charging algorithm decision matrix based on the score being in a range associated with the charging recommendation; and
sending the charging recommendation to the charger.

10. A method for managing sharing of electrochemical impedance spectroscopy ("EIS") battery testing data, comprising:
determining whether there is a request to download information on a battery from a charger;
in response to determining that there is a download information on the battery from the charger:
receiving battery identifying information for the battery from the charger;
retrieving information on the battery from the learned database associated with the battery identifying information; and
sending the information on the battery to the charger;
determining whether there is a request to upload from an EIS system; and
in response to determining that there is a request to upload from the EIS system:
receiving an EIS test waveform for an EIS test on the battery, a response waveform for the EIS test, and performance parameters of the battery from the EIS system;
storing the EIS test waveform, the response waveform, and the performance parameters in a learned database as associated with the battery; and
analyzing the EIS test waveform, the response waveform, and the performance parameters with historical EIS test waveforms, historical response waveforms, and historical performance parameters associated with the battery to determine EIS testing information for the battery.

11. The method of claim 10, further comprising:
receiving battery identifying information for the battery from the EIS system;
retrieving the EIS testing information for the battery from the information on the battery stored on the learned database, wherein the EIS testing information includes parameters of an EIS test waveform for the battery and EIS testing commands for the battery; and
sending the EIS testing information for the battery to the EIS system.

12. The method of claim 11, further comprising
determining whether there is a request to download EIS testing information for the battery from the EIS system in response to determining that there is not a request to upload from the EIS system, wherein receiving battery identifying information for the battery, retrieving the EIS testing information for the battery from the information on the battery stored on the learned database, and sending the EIS testing information for the battery to the EIS system occur in response to determining that there is a request to download EIS testing information for the battery from the EIS system.

13. An electrochemical impedance spectroscopy analyzer ("EISA") system, comprising:
an EISA network, comprising:
a charging module; and
a learned database,
wherein the charging module is configured to:
determine whether there is a request to upload from the electrochemical impedance spectroscopy ("EIS") system;
in response to determining that there is a request to upload from the EIS system:
receive an EIS test waveform for an EIS test on a battery, a response waveform for the EIS test, and performance parameters of the battery from an EIS system communicatively connected to the EISA network; and
store the EIS test waveform, the response waveform, and the performance parameters in the learned database as associated with the battery;
determine whether there is a request to download EIS testing information for the battery from the EIS system in response to determining that there is not a request to upload from the EIS system; and in response to determining that there is a request to download EIS testing information for the battery from the EIS system:
receive battery identifying information for the battery from the EIS system;
retrieve the EIS testing information for the battery from the information on the battery stored on the learned database, wherein the EIS testing information includes parameters of an EIS test waveform for the battery and EIS testing commands for the battery; and
send the EIS testing information for the battery to the EIS system; and wherein the learned database is configured to, in response to determining that there is a request to upload from the EIS system, analyze the EIS test waveform, the response waveform, and the performance parameters with historical EIS test waveforms, historical response waveforms, and historical performance parameters associated with the battery to determine EIS testing information for the battery.

14. An electrochemical impedance spectroscopy analyzer ("EISA") system, comprising:
an electrochemical impedance spectroscopy ("EIS") system electrically connectable to a battery, and comprising:
a control module;
a data database; and
a command database;
wherein the control module is configured to:
determine whether EIS testing information for the battery is available in the data database and the command database;
send a request to download EIS testing information for the battery to an EISA network communicatively connected to the EIS system;
receive EIS testing information for the battery from the EISA network, wherein the EIS testing information includes EIS test waveform parameters and EIS testing commands;
store the EIS test waveform parameters in the data database as associated with the battery; and
store the EIS testing commands in the command database as associated with the battery; and a charger communicatively connected to the EIS system and electrically connectable to the battery, and comprising:
a charger control module; and
a charger database;
wherein the charger control module is configured to:
identify the battery;
determine whether the battery needs charging; and
send an EIS test request to the EIS system in response to determining that the battery needs charging.

15. An electrochemical impedance spectroscopy analyzer ("EISA") system, comprising:
an electrochemical impedance spectroscopy ("EIS") system electrically connectable to a battery, and comprising a control module;
a charger communicatively connected to the EIS system and electrically connectable to the battery, and comprising:
a charger control module; and
a charger database;
wherein the charger control module is configured to:
identify the battery;
determine whether the battery needs charging; and
send an EIS test request to the EIS system in response to determining that the battery needs charging; and wherein the control module configured to:
receive the EIS test request;
prepare an EIS test waveform according to EIS test waveform parameters associated with the battery;
apply the EIS test waveform to the battery according to EIS testing commands associated with the battery;
collect a response waveform from the battery according to the EIS testing commands;
convert the response waveform from analog signals to digital signals;
apply a charging algorithm to the EIS test waveform parameters and the digital signals of the response waveform to determine a charging recommendation; and
send the charging recommendation to the charger.

16. The EISA system of claim 15, wherein the EIS system further comprises:
a data database; and
a command database, and
wherein the control module is further configured to:
retrieve the EIS test waveform parameters associated with the battery from the data database;
retrieve the EIS testing commands associated with the battery from the command database;
store the digital signals of the response waveform in the data database as associated with the battery and the EIS test waveform parameters; and
send an upload request for the digital signals of the response waveform to an EISA network communicatively connected to the EIS system.

17. The EISA system of claim 15, wherein the EIS system further comprises a charging algorithm decision matrix, and
wherein the control module is further configured such that applying a charging algorithm to the EIS test waveform parameters and the digital signals of the response waveform to determine a charging recommendation comprises:
comparing the EIS test waveform parameters and the digital signals of the response waveform;
generating a score for the comparison of the EIS test waveform parameters and the digital signals of the response waveform;
extracting the charging recommendation from the charging algorithm decision matrix based on the score being in a range associated with the charging recommendation; and
sending the charging recommendation to the charger.

18. A method for managing sharing of electrochemical impedance spectroscopy ("EIS") battery testing data, comprising:
determining whether there is a request to upload from the EIS system;
in response to determining that there is a request to upload from the EIS system:
receiving an EIS test waveform for an EIS test on a battery, a response waveform for the EIS test, and performance parameters of the battery from an EIS system;
storing the EIS test waveform, the response waveform, and the performance parameters in a learned database as associated with the battery; and analyzing the EIS test waveform, the response waveform, and the performance parameters with historical EIS test waveforms, historical response waveforms, and historical performance parameters associated with the battery to determine EIS testing information for the battery;

determining whether there is a request to download EIS testing information for the battery from the EIS system in response to determining that there is not a request to upload from the EIS system; and in response to determining that there is a request to download EIS testing information for the battery from the EIS system:

receiving battery identifying information for the battery from the EIS system;

retrieving the EIS testing information for the battery from the information on the battery stored on the learned database, wherein the EIS testing information includes parameters of an EIS test waveform for the battery and EIS testing commands for the battery; and sending the EIS testing information for the battery to the EIS system.

\* \* \* \* \*